US010084287B2

(12) United States Patent
Bernier et al.

(10) Patent No.: US 10,084,287 B2
(45) Date of Patent: Sep. 25, 2018

(54) MID-INFRARED LASER SYSTEM, MID-INFRARED OPTICAL AMPLIFIER, AND METHOD OF OPERATING A MID-INFRARED LASER SYSTEM

(71) Applicant: UNIVERSITÉ LAVAL, Québec (CA)

(72) Inventors: Martin Bernier, Québec (CA); Réal Vallée, Québec (CA); Vincent Fortin, Québec (CA); Jean-Christophe Gauthier, Québec (CA); Simon Duval, L'Ancienne-Lorette (CA)

(73) Assignee: UNIVERSITÉ LAVAL, Québec (CA)

( * ) Notice: Subject to any disclaimer, the term of this patent is extended or adjusted under 35 U.S.C. 154(b) by 0 days.

(21) Appl. No.: 15/783,152

(22) Filed: Oct. 13, 2017

(65) Prior Publication Data

US 2018/0109078 A1    Apr. 19, 2018

(30) Foreign Application Priority Data

Oct. 14, 2016   (CA) .................................... 2945462

(51) Int. Cl.
*H01S 5/30* (2006.01)
*H01S 5/50* (2006.01)
(Continued)

(52) U.S. Cl.
CPC .............. *H01S 5/30* (2013.01); *H01S 5/0202* (2013.01); *H01S 5/0265* (2013.01);
(Continued)

(58) Field of Classification Search
CPC ...... H01S 5/30; H01S 5/1003; H01S 5/02284; H01S 5/041; H01S 5/2222; H01S 5/0265; H01S 5/0202; H01S 5/50; H01S 5/0656
See application file for complete search history.

(56) References Cited

U.S. PATENT DOCUMENTS

| 2006/0029111 A1* | 2/2006 | Liu ..................... H01S 3/06708 372/6 |
| 2018/0069366 A1* | 3/2018 | Ahmadi .............. H01S 3/06754 |

FOREIGN PATENT DOCUMENTS

CN    103151687 B    8/2015

OTHER PUBLICATIONS

Gauthier et al., "In-Amplifier mid-infrared supercontinuum generation", Optics Letters, vol. 40, No. 22, Nov. 15, 2015, pp. 5247-5250, Canada.

(Continued)

*Primary Examiner* — Dung Nguyen
(74) *Attorney, Agent, or Firm* — Norton Rose Fulbright Canada LLP; Alexandre Daoust

(57) ABSTRACT

The mid-infrared laser system has an amplifier including at least one pump laser adapted to generate a pump laser beam and a length of fiber made of a low phonon energy glass and having at least one laser-active doped region between a first end and a second end, and a seed laser to generate a seed laser beam having a seed optical spectrum in the mid-infrared. The seed laser beam is launched into the first end to generate a mid-infrared laser beam outputted from the second end via stimulated emission upon pumping of the at least one laser-active doped region with the pump laser beam. When the power of the pump laser exceeds a spectrum modification threshold, the mid-infrared laser beam has an output optical spectrum being broadened relative to the seed optical spectrum.

22 Claims, 14 Drawing Sheets

(51) Int. Cl.

| | |
|---|---|
| *H01S 5/02* | (2006.01) |
| *H01S 5/026* | (2006.01) |
| *H01S 5/065* | (2006.01) |
| *H01S 5/22* | (2006.01) |
| *H01S 5/04* | (2006.01) |
| *H01S 5/022* | (2006.01) |
| *H01S 5/10* | (2006.01) |

(52) U.S. Cl.
CPC .......... *H01S 5/02284* (2013.01); *H01S 5/041* (2013.01); *H01S 5/0656* (2013.01); *H01S 5/1003* (2013.01); *H01S 5/2222* (2013.01); *H01S 5/50* (2013.01)

(56) References Cited

OTHER PUBLICATIONS

Gauthier et al., "Mid-IR supercontinuum from 2.4 to 5.4 μm in a low-loss fluoroindate fiber", Optics Letters, vol. 11, No. 8, Apr. 15, 2016, pp. 1756-1759, Canada.
Duval et al., "Watt-level fiber-based femtosecond laser source tunable from 2.8 to 3.6 μm", Optics Letters, vol. 41, No. 22, Nov. 15, 2016, pp. 5294-5297, Canada.
Robichaud et al., "Compact 3-8 μm supercontinuum generation in a low-loss As2Se3 step-index fiber", Optics Letters, vol. 41, No. 20, Oct. 15, 2016, pp. 4605-4608, Canada.
Duval et al., "Femtosecond fiber lasers reach the mid-infrared", Optica, vol. 2, No. 7, Jul. 2015, pp. 623-626, Canada.
Duval et al., "1.7-W femtosecond fiber-based source at 3.6 μm", Frontiers in Optics 2016, OSA Technical Digest (online) (Optical Society of America, 2016), paper FF2B.5.

\* cited by examiner

MID-INFRARED LASER SYSTEM, MID-INFRARED OPTICAL AMPLIFIER, AND METHOD OF OPERATING A MID-INFRARED LASER SYSTEM

FIELD

The improvements generally relate to laser systems and more particularly relate to laser systems which are configured to emit in the mid-infrared.

BACKGROUND

As it will be appreciated by the skilled reader, a mid-infrared laser beam having an optical spectrum in the mid-infrared, i.e. between 2.5 µm and 20 µm, is particularly useful for a range of applications. For instance, infrared spectroscopy, infrared countermeasures, early disease detection, and any other suitable application can all benefit from simple and cost effective mid-infrared laser systems.

However, there is a need in providing mid-infrared laser beams covering the mid-infrared, especially wavelengths outside the ranges covered by existing laser transitions, which typically require rather complex and costly mid-infrared laser systems. There thus remains room for improvement.

SUMMARY

In accordance with one aspect, there is provided a mid-infrared laser system which aims at providing relief to specific needs of the industry.

In accordance with another aspect, there is provided a mid-infrared laser system comprising: an amplifier including at least one pump laser adapted to generate a pump laser beam; and a length of fiber made of a low phonon energy glass and having at least one laser-active doped region between a first end and a second end; a seed laser adapted to generate a seed laser beam having a seed optical spectrum in the mid-infrared portion of the electromagnetic spectrum, the seed laser beam being launched into the first end to generate a mid-infrared laser beam outputted from the second end via stimulated emission upon pumping of the at least one laser-active doped region with the pump laser beam; and a spectrum modification threshold above which the power of the pump laser beam causes the mid-infrared laser beam to have an output optical spectrum being at least one of broadened and shifted relative to the seed optical spectrum.

For instance, one specific need of the industry occurs in applications requiring a mid-infrared laser beam having a significant portion of its optical power at wavelengths longer than 3.0 µm. In this aspect, the seed laser beam is chosen so that it has a seed wavelength equal or above 2.5 µm. By doing so, it was found that the amount of energy generated above 3.0 µm can be increased in comparison with conventional mid infrared lasers which use conventional seed lasers emitting between 1 µm and 2.0 µm. In some embodiments, the output optical spectrum of the mid-infrared laser beam includes at least 80% of its optical power at wavelengths longer than 3.0 µm.

One other specific need of the industry occurs in providing mid-infrared laser systems which can produce satisfactory optical power in the mid-infrared in a durable manner. In this aspect, an endcap can be provided at the first end, the second end, or both. In some embodiments, the endcap includes a cylindrical waveguide made of a low phonon energy glass being less permeable to OH— ions than the low phonon energy glass of the length of fiber. Such an endcap can prevent OH— ions from reaching, and potentially degrade, the length of fiber.

In accordance with another aspect, there is provided a mid-infrared optical amplifier for amplifying a seed laser beam in the mid-infrared portion of the electromagnetic spectrum, the mid-infrared optical amplifier comprising: an amplifier including at least one pump laser adapted to generate a pump laser beam; a length of fiber made of a low phonon energy glass and having at least one laser-active doped region between a first end and a second end, the seed laser beam being launchable into the first end to generate a mid-infrared laser beam outputted from the second end via stimulated emission upon pumping of the at least one laser-active doped region with the pump laser beam; and a spectrum modification threshold above which the power of the pump laser beam causes the mid-infrared laser beam to have an output optical spectrum being at least one of broadened and shifted relative to the seed optical spectrum.

In accordance with another aspect, there is provided a method of operating a mid-infrared laser system having a seed laser adapted to generate a seed laser beam having a seed optical spectrum in the mid-infrared portion of the electromagnetic spectrum, and an amplifier including at least one pump laser adapted to generate a pump laser beam and a length of fiber made of a low phonon energy glass and having at least one laser-active doped region, the method comprising the steps of: pumping the at least one laser-active doped region of the length of the fiber by launching the pump laser beam into one of the first end and a second end; seeding the length of fiber by launching the seed laser beam into the first end; outputting, at the second end, a mid-infrared laser beam resulting from the optical amplification of the seed laser beam via stimulated emission; and modifying an output optical spectrum of the mid-infrared laser beam by varying a power of the pump laser beam above a spectrum modification threshold.

Many further features and combinations thereof concerning the present improvements will appear to those skilled in the art following a reading of the instant disclosure.

DESCRIPTION OF THE FIGURES

In the figures.

DETAILED DESCRIPTION

Figure 1:
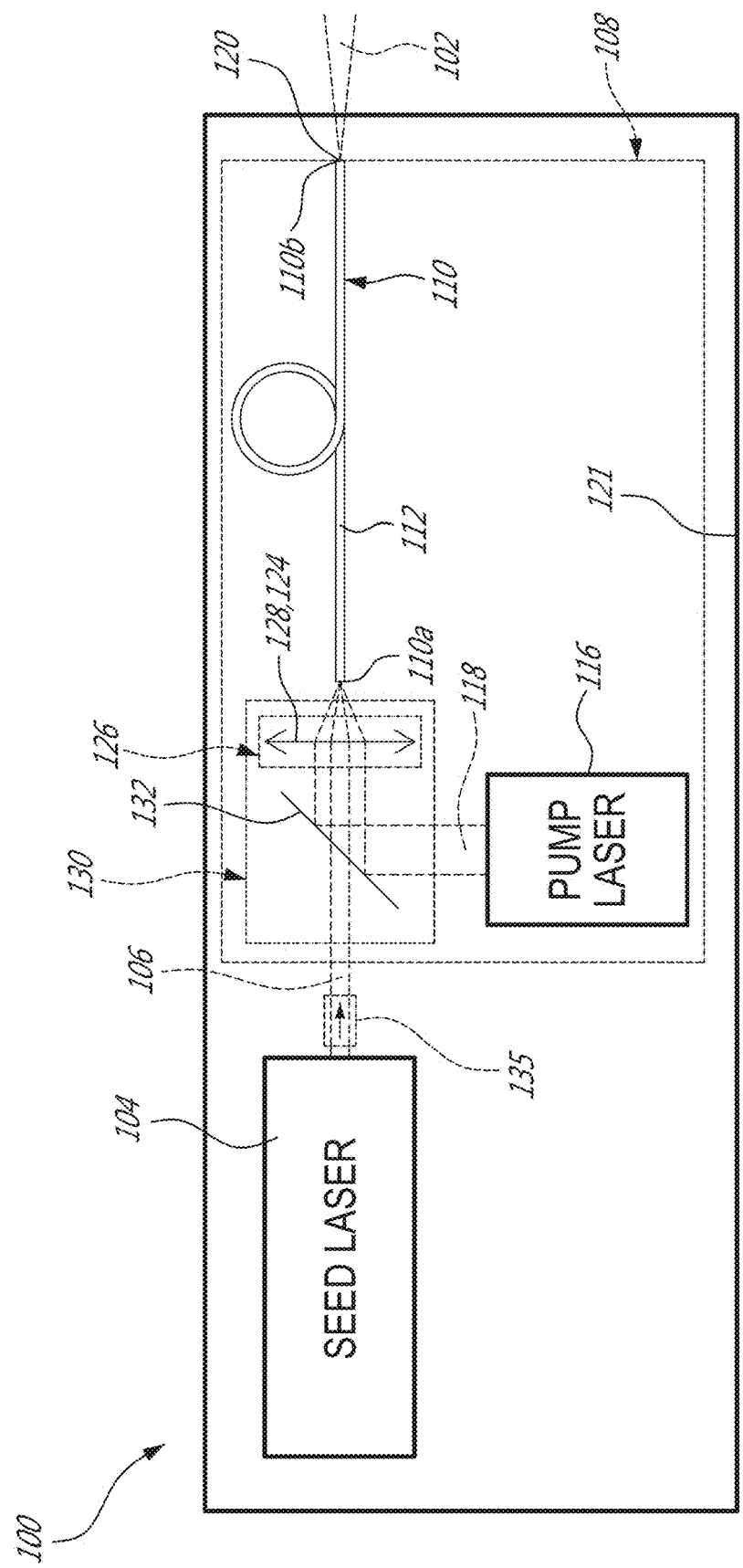
FIG. 1 is a schematic view of an example of a mid-infrared laser system configured in a co-propagating pumping scheme, in accordance with an embodiment.

FIG. 1 shows a schematic view of an example of a mid-infrared laser system 100, in accordance with an embodiment. As will be understood, in this disclosure, the expression "mid-infrared laser system" is used to encompass any laser system adapted and configured to generate a mid-infrared laser beam 102 having an output optical spectrum ranging in the mid-infrared, i.e. between 2.5 µm and 20 µm.

Broadly described, the mid-infrared laser system 100 has a seed laser 104 adapted to generate a seed laser beam 106 with a seed optical spectrum in the mid-infrared.

The mid-infrared laser system 100 has an amplifier 108 including a length of fiber 110 made of a low phonon energy glass and having at least laser-active doped region 112 doped with one or more laser-active dopants 114, and one or more than one pump laser 116 ("the pump laser 116") adapted to generate one or more than one pump laser beam 118 ("the pump laser beam 118"). The length of fiber 110 has a first end 110a in which is launched the seed laser beam 106 and a second end 110b where the mid-infrared laser beam 102 is outputted.

For ease of reading, in this disclosure, the optical spectrum of the seed laser beam 106 is referred to as the "seed optical spectrum" as it represents the spectral distribution of optical power that is seeded or inputted into the length of fiber 110. Similarly, the optical spectrum of the mid-infrared laser beam 102 is referred to as the "output optical spectrum" as it represents the spectral distribution of optical power of outputted from the length of fiber 110.

In this disclosure, the expression "low phonon energy glass" is intended to encompass any glass having a maximum phonon energy lower than the phonon energy of silica-based glass, i.e. lower than 800 cm$^{-1}$. Fibers made of a low phonon energy glass generally have a transmittance window ranging in the mid-infrared (i.e. 2.5 µm to longer wavelengths), unlike fibers made of a high phonon energy glass, such as a silica-based glass, which rather exhibit a transmittance window only in a given portion of the near-infrared (e.g., up to 2.4 µm). Understandably, using a fiber made of a low phonon energy glass allows photons at wavelengths in the mid-infrared to propagate along the length of fiber 110, in contrast with fibers of a high phonon energy glass which instead prevent propagation of these photons.

In cases where the laser-active doped region 112 is pumped in the near-infrared (e.g., erbium ions), the low phonon energy glass of the length of fiber 110 has a transmittance window extending in the near-infrared. However, in some other cases, the laser-active doped region 112 is pumped in the mid-infrared so a transmittance window extending in the near-infrared can be omitted.

Examples of low phonon energy glass includes fluoride-, chalcogenide-, chalcohalide- or telluride-based glass. In some circumstances, even some oxide glasses (e.g., tellurite-based glass) can be considered as a low phonon energy glass. For instance, in some embodiments, the low phonon energy glass is a zirconium fluoride glass having a composition including $ZrF_4$ such as ZBLAN ($ZrF_4/HfF_4$, $BaF_2$, $LaF_3$, NaF, and $AlF_3$). In some other embodiments, the low phonon energy glass is a indium fluoride glass having a composition including $InF_3$. In alternate embodiments, the low phonon energy glass is an aluminum fluoride glass having a composition including $AlF_3$. In further embodiments, the low phonon energy glass is a chalcogenide glass having a composition including $As_2S_3$, $As_2Se_3$, AsTe, AsSSe, AsSTe, GaLaS, GeAsS, GeAsSe or the like. Any other suitable low phonon energy glass having a transmittance window in the mid-infrared can be used.

As will be understood, the mid-infrared laser beam 102 results from the optical amplification of the seed laser beam 106 via stimulated emission upon pumping (i.e. exciting) of the laser-active doped region 112 with the pump laser beam 118. In this example, the doped region 112 extends along the entire length of fiber 110. However, it will be understood herebelow that the doped region 112 can be shorter than the length of fiber 110. More specifically, the seed laser beam 106 and the pump laser beam 118 are both launched inside the length of fiber 110 simultaneously such that at least some individual laser-active dopants 114 are pumped to an upper state of a laser transition by the pump laser beam 118 and then caused to drop to a lower state of the laser transition as a result of an interaction between a photon of the seed laser beam 106 and a corresponding individual laser-active dopant 114. As a result, an additional photon, which has a wavelength, a phase and a direction of propagation identical to that of the photon of the seed laser beam 106, is generated via stimulated emission.

The seed laser beam 106 is said to be optically amplified due to the amount of additional photons that are generated as the pumped individual laser-active dopant are dragged down to their respective lower state by the seed laser beam 106. Accordingly, the seed laser beam 106 is optically amplified progressively along the laser-active doped region 112 of the length of fiber 110, and exits as the mid-infrared laser beam 102 at an endface 120 of the second end 110b.

As it will be understood, the power of the pump laser 116, i.e. the pump power $P_{PUMP}$, can be controlled to determine at which extent the seed laser beam 106 is optically amplified. Indeed, for optical amplification to occur, the pump power $P_{PUMP}$ is set above an amplification threshold $T_A$. When the pump power $P_{PUMP}$ is above the amplification threshold $T_A$, optical amplification is allowed to occur as the seed laser beam 106 propagates along the laser-active doped region 112 of the length of fiber 110.

In some embodiments, the pump power $P_{PUMP}$ is increased well above the amplification threshold $T_A$ in order to cause the output optical spectrum of the mid-infrared laser beam 102 to be broadened, shifted, or both, due to dispersion and nonlinear effect(s) (e.g., soliton fission, four-wave mixing, self-phase modulation).

More specifically, the mid-infrared laser system 100 has a spectrum modification threshold $T_{SM}$ above which the power $P_{PUMP}$ of the pump laser beam 118 causes the mid-infrared laser beam 102 to have an output optical spectrum being broadened, and even shifted towards longer wavelengths in some cases, relative to the seed optical spectrum. In this manner, the seed laser beam 106 can be amplified into a mid-infrared laser beam 102 having optical power at wavelengths above the seed wavelength, e.g., between 2.5 μm and 20 μm.

Figure 1A:
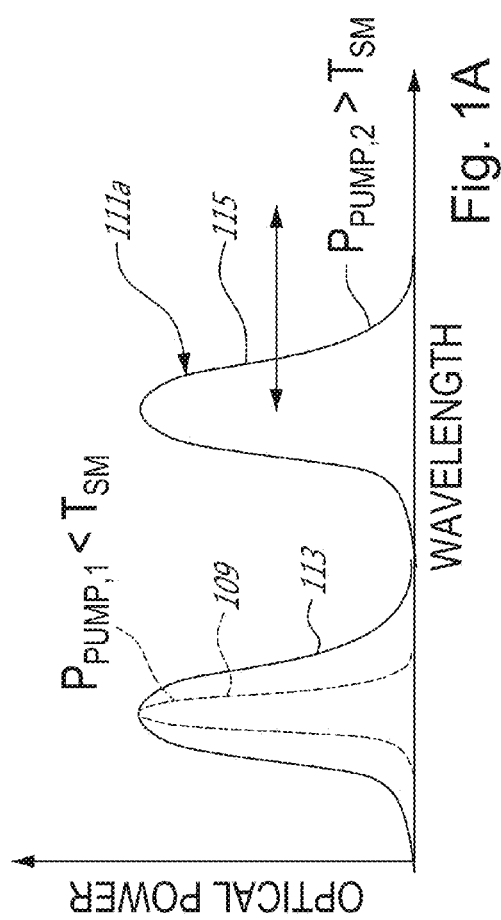
FIG. 1A is a graph showing a first example of an output optical spectrum of a mid-infrared laser beam obtained with the mid-infrared laser system of FIG. 1 when operated with a pump power above a spectrum modification threshold.

For instance, FIG. 1A shows an example of a seed optical spectrum 109 of a typical seed laser beam when amplifier is operated with a first power $P_{PUMP,1}$, smaller than the spectrum modification threshold $T_{SM}$. In contrast, FIG. 1A also shows a first output optical spectrum 111a of a typical mid-infrared laser beam when the amplifier is operated with a second power $P_{PUMP,2}$ which exceeds the spectrum modification threshold $T_{SM}$. As can be seen, in this embodiment, the first output optical spectrum 111a has two spectral features wherein a first spectral feature 113 substantially corresponds to a broadened version of the seed optical spectrum 109 and a second spectral feature 115 being shifted towards longer wavelengths. It can thus be said that the first output optical spectrum 111a is broadened relative to the seed optical spectrum 109. Moreover, it was found that by varying the pump power $P_{PUMP}$ above the spectrum modification threshold $T_{SM}$, the first output spectrum 111a can be modified as desired. Indeed, the second spectral feature 115 can be moved towards longer or shorter wavelengths by simply varying the power $P_{PUMP}$ up or down but above the spectrum modification threshold $T_{SM}$.

Figure 1B:
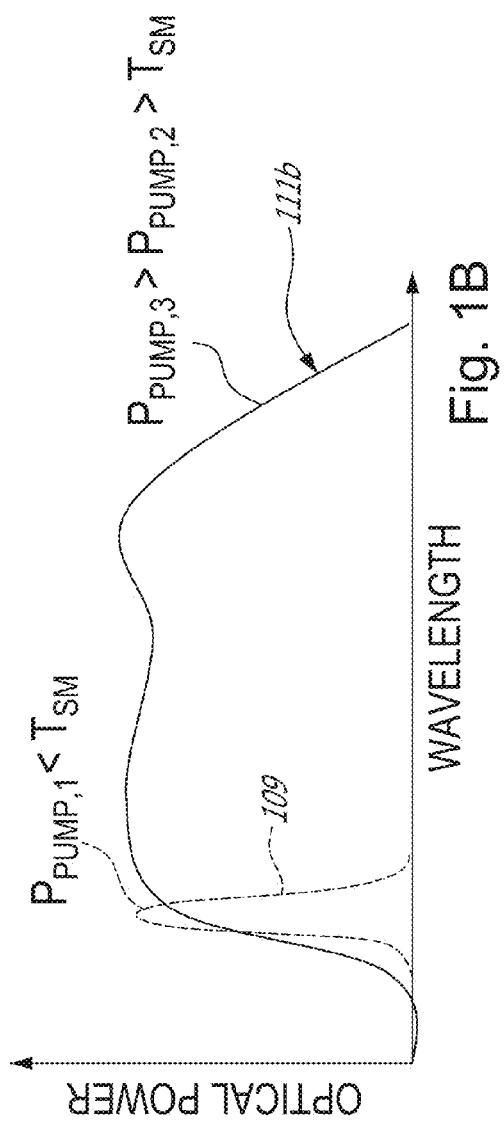
FIG. 1B is a graph showing a second example of an output optical spectrum of a mid-infrared laser beam obtained with the mid-infrared laser system of FIG. 1 when operated with a pump power further above the spectrum modification threshold.

By operating the amplifier with a third pump power $P_{PUMP,3}$ greater than the second pump power $P_{PUMP,2}$, the first output spectrum 111a can be modified to a second output spectrum 111b such as the one shown in FIG. 1B. As illustrated, the second output optical spectrum 111b is even more broadened relative to the seed optical spectrum 109 than the first optical spectrum 111a. It is noted that the output optical spectrum may jump directly to the second output optical spectrum 111b in some embodiments, thus omitting the first output optical spectrum having a tunable (i.e. tailorable) spectral feature.

As can be understood, the pump power $P_{PUMP}$, the amplification threshold $T_A$ and the spectrum modification threshold $T_{SM}$ are relative values which depend on the seed laser beam, they can thus vary from one embodiment to another. Specifically, the pump power $P_{PUMP}$, the amplification threshold $T_A$ and the spectrum modification threshold $T_{SM}$ can vary as function of the energy carried by the seed laser beam, and more specifically, by the repetition rate of the seed laser beam, the duration of its pulses and other characteristic parameters of the seed laser beam.

It is known that low phonon energy glass can be highly reactive to the surrounding environment, and more specifically to OH— ions. Accordingly, in the embodiment illustrated in FIG. 1, the mid-infrared laser system 100 is enclosed within a chamber 121 in a manner which maintains the length of fiber in a moisture-less environment to prevent degradation of the length of fiber via diffusion of OH— ions into the length of fibre, and more particularly into endfaces of the length of fiber. For instance, the housing can be provided either in the form of a vacuum chamber exempt from air thus exempt from OH— ions or in the form of a controlled environment chamber including dry air or inert gas such as nitrogen. In some other embodiments, the chamber 121 can be omitted and this function is assumed by a dry-air fan blowing dry air onto each end face of the length of fiber to prevent diffusion of OH— ions thereinto.

As it will be understood, the length of fiber 110 can have one or more than one laser-active doped region 112 therealong. For instance, the length of fiber 110 can include a single active fiber segment (i.e. doped fiber), as shown in FIG. 1, or a combination of one or more active fiber segment and one or more passive fiber segment (i.e. undoped fiber). Depending on the embodiment, the seed laser beam can be launched either in an active or a passive fiber segment of the length of fiber 110. In this embodiment, the active fiber segment can be optically coupled to the passive fiber segment via a serial connection (e.g., fusion splice, mechanically abutment) or via a lens system (e.g., two or more lenses, a graded-index (GRIN) lens). In alternate embodiments, an active fiber segment can be provided between two passive fiber segments. The length of fiber 110 can include any suitable combination of active and passive fiber segments deemed satisfactory for a given application.

Figure 2A:
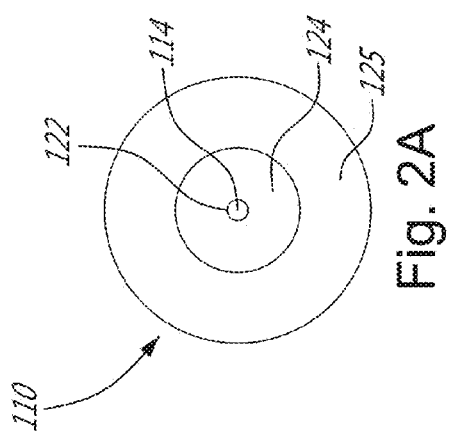
FIGS. 2A-B are cross-sectional views showing a single-clad fiber and a double-clad fiber, respectively.
Figure 2B:
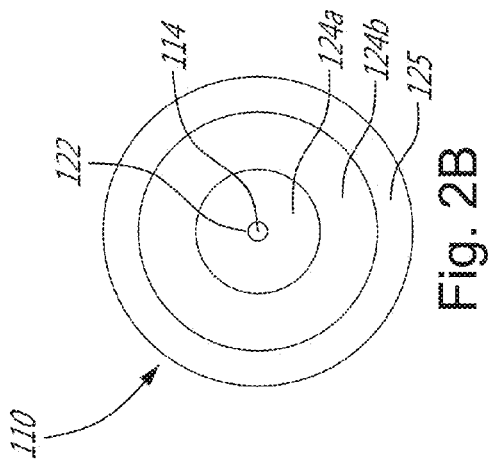

In some embodiments, the length of fiber 110 generally has a core 122 and at least one cladding around the core 122 to provide suitable guiding properties, as depicted in the cross-sectional views of FIGS. 2A and 2B. More specifically, FIG. 2A shows a cross-sectional view of a length of fiber 110 having the core 122 and a single cladding 124, wherein a refractive index of the core 122 is higher than a refractive index of the cladding 124 to provide guiding properties to the core 122. Such fibers are said to be "single-clad". FIG. 2B shows a cross-sectional view of a length of fiber 110 having the core 122, an inner cladding 124a and an outer cladding 124b, wherein light can be guided both along the core 122 and along the inner cladding 124a. More specifically, a refractive index of the core 122 is higher than a refractive index of the inner cladding 124a, which is in turn higher than a refractive index of the outer cladding 124b. Such fibers are said to be "double-clad". Both these two types of fiber have a buffer coating 125 typically including polymer (e.g., acrylate) covering the cladding 124 in the case of single-clad fibers or the outer cladding 124b in the case of double-clad fibers. In some other embodiments, the fiber can be microstructured. For instance, the length of fiber can be coreless and the guiding properties can be provided by hollow microstructures extending along the fiber. Other examples of microstructured fiber can also be used.

The laser-active doped region 112 is said to be "doped" as it includes the one or more laser-active dopant 114 distributed inside and along the core 122 of the length of fiber 110. The laser-active dopant 114 is selected so that it can radiate photons in the mid-infrared when pumped with the pump laser beam 118. In some embodiments, the length of fiber 110 is single-clad and the pump laser beam 118 is launched directly inside the core 122 in order to pump the laser-active dopant 114 of the laser-active doped region 112. However, in some other embodiments, the length of fiber 110 is double-clad and the pump laser beam 118 is launched inside the inner cladding 124a in order to be gradually absorbed by the laser-active doped region 112 along the length of fiber 110.

In some embodiments, the laser-active dopant 114 is provided in the form of rare earth ions such as erbium ions ($Er^{3+}$), thulium ions ($Tm^{3+}$), holmium ions ($Ho^{3+}$), dysprosium ions ($Dy^{3+}$), praseodymium ions ($Pr^{3+}$), ytterbium ions ($Yb^{3+}$) or any combination thereof. For instance, in embodiments where the laser-active dopant 114 is provided in the form of erbium ions, the erbium ions can radiate photons in the mid-infrared, such as about 2.8 μm, when they are pumped with photons at 976 nm, due to the presence of the $^4I_{11/2} \rightarrow {}^4I_{13/2}$ electronic transition of erbium ions. In some other embodiments, the laser-active dopant 114 is provided in the form of transition metals such as iron (Fe) ions, cobalt (Co) ions, chromium (Cr) ions or any combination thereof.

In alternate embodiments, the laser-active dopant 114 is provided in the form of nanocrystals such as quantum structures (e.g., quantum dots) and the like. Any other suitable laser-active dopant can be used to dope the laser-active doped region 112.

Referring back to the specific embodiment of FIG. 1, the seed laser 104 and the pump laser 116 are configured in a co-propagating pumping scheme wherein the seed laser beam 106 and the pump laser beam 118 are both propagated along the length of fiber 110 in the same direction. However, in some other embodiments, the seed laser and the pump laser are configured in a contra-propagating pumping scheme wherein the seed laser beam and the pump laser beam are propagated along the length of fiber but in direction opposite from one another (an example of which is described with reference to FIG. 12). In alternate embodiments, more than one pump laser can be used. For instance, two pump lasers can be used to launch a first pump beam into the first end 110a and to launch a second pump beam into the second end 110b to pump the laser-active doped region 112 of the length of fiber 110 in two opposite directions to provide more gain.

In this co-propagating pumping scheme, a seed injection assembly 126 including a seed injection lens 128 is used to optically couple the seed laser 104 and the length of fiber 110 to one another. More specifically, the seed injection lens 128 is positioned to receive the seed laser beam 106 from the seed laser 104 and is adapted to focus it towards the first end 110a and inside the core 122 thereof.

Also, a pump injection assembly 130 including a dichroic surface 132 and a pump injection lens 134 is used to optically couple the pump laser 116 and the length of fiber 110 to one another. In this embodiment, the dichroic surface 132 is positioned to receive the pump laser beam 118 and adapted to reflect it towards the pump injection lens 134 while transmitting the seed laser beam 106 thereacross. In other words, the dichroic surface 132 is configured and adapted to be reflective to the pump laser beam 118, and to be optically transparent to the seed laser beam 106. In this way, the seed laser beam 106 can be propagated across the dichroic surface 132 without undergoing substantial loss while the pump laser beam 118 is suitably redirected towards the length of fiber 110. The pump injection lens 134 is positioned to receive the pump laser beam 118 which is reflected from the dichroic surface 132 and adapted to focus the pump laser beam 118 towards the first end 110a and inside the core 122 thereof. As can be understood, the seed injection lens 128 and the pump injection lens 134 are provided as a single optical component in this example.

It is noted that other pumping schemes can be used. For instance, a pumping scheme involving a dichroic surface being reflective to the seed laser beam and optically transparent to the pump laser beam can be used. Also, it is noted that a laser-active dopant having a laser transition at 3.5 μm can require a first pump laser beam at 980 nm and a second pump laser beam at 2 μm. In this case, the dichroic surface can be adapted to be reflective both in the near-infrared and in the mid-infrared while being optically transparent to the seed laser beam.

It is believed that, in alternate embodiments, the seed laser beam and the pump laser beam can be optically coupled to the length of fiber such as to avoid free-space propagation to form an all-fiber mid-infrared laser system. For instance, the seed laser can be a seed fiber laser having an output fiber optically coupled (e.g., fusion spliced, mechanically abutted) to the length of fiber whereas the pump laser beam can be optically coupled to the length of fiber using fiber couplers, fiber combiners and the like.

In the embodiment of FIG. 1, the seed laser 104 can be adapted to generate the seed laser beam 106 in a pulsed wave (PW) mode wherein the pulses have a temporal duration which can range between 1 ms and 1 fs and a repetition rate which can range between 1 Hz and 1 GHz. In some embodiments, the seed laser 104 is configured to generate the seed laser beam 106 directly at the desired wavelength. In some other embodiments, the seed laser 104 is configured to generate a preliminary laser beam which is then converted to higher wavelengths using a nonlinear conversion subsystem. However, as it will be understood, any suitable seed laser 104 may be used. It is noted that the seed laser can also be operated in a CW mode in some other embodiments.

The pump laser 116 can be adapted to generate the pump laser beam 118 in a continuous wave (CW) mode wherein the pump power can be fixed higher than the given threshold or controlled as desired by the user. Any suitable pump laser 116 can be used. For instance, the pump laser 116 can include a laser diode powered with a variable power supply unit with which the pump power can be controlled. The skilled reader will appreciate that the pump laser can be operated in a PW mode. For instance, the temporal duration of such pump pulses can range between the millisecond and the nanosecond.

It was also found that, in some applications, obtaining a mid-infrared laser beam 102 having an optical spectrum between 3.0 μm and longer wavelengths is desirable. For these applications, it was found that using a seed laser 104 having a seed wavelength equal or longer than 2.5 μm can increase the amount of energy generated above 3.0 μm in comparison with conventional mid-infrared lasers which use conventional seed lasers emitting between 1.0 μm and 2.0 μm. Indeed, it was found that when such conventional seed lasers are used, the mid-infrared laser beam 102 so generated typically spans between the conventional seed laser emission wavelength and longer wavelengths. However, in applications where energy is specifically sought between 3.0 μm and longer wavelengths, the amount of energy that is distributed between the conventional seed laser emission wavelength and 3.0 μm is lost. Such an amount of energy is typically lost at the expense of generation of optical power at longer wavelengths. Accordingly, it was found useful to go against conventional practices and use a seed laser 104 having a seed wavelength equal or greater than 2.5 μm in these applications.

In the depicted embodiment, the seed laser 104 is provided in the form of an optical parametric generation (OPG) source having a seed wavelength of 2.75 μm. In this embodiment, the seed laser 104 has a repetition rate ranging between 2 kHz and 20 kHz, a nominal temporal duration of 400 ps and a nominal pulse energy of 1 μJ. Such an OPG source is manufactured by Light Matter Interaction Inc. (Toronto, Canada). In an experiment reported in "Gauthier, Jean-Christophe, et al. "In-amplifier mid-infrared supercontinuum generation." Optics letters 40, 22 (2015): 5247-5250.", authored by the inventors, such an OPG source was used as the seed laser of the mid-infrared laser to produce a mid-infrared laser beam having an optical spectrum spanning between 2.6 μm and 4.1 μm. In this specific experiment, up to 82% of the energy was generated beyond 3.0 μm, which was found to be useful in applications requiring an optical spectrum distributed between 3.0 μm and 5.0 μm.

In another embodiment, the seed laser 104 is provided in the form of a fiber laser mode-locked by nonlinear polarization rotation having a seed wavelength of 2.8 μm, a repetition rate ranging between 10 MHz and 100 MHz, a nominal temporal duration ranging between 150 fs and 500 fs and a nominal pulse energy ranging between 1 nJ and 10 nJ. Such a fiber laser is described in the scientific publication "Duval, Simon, et al. "Femtosecond fiber lasers reach the mid-infrared." Optica 2, 7 (2015): 623-626".

Also shown in FIG. 1 is an optical isolator 135 positioned in the path of the seed laser beam 106, between the seed laser 104 and the length of fiber 110. The optical isolator 135 is used to prevent unwanted feedback to be reflected back to the seed laser 104.

Figure 3:
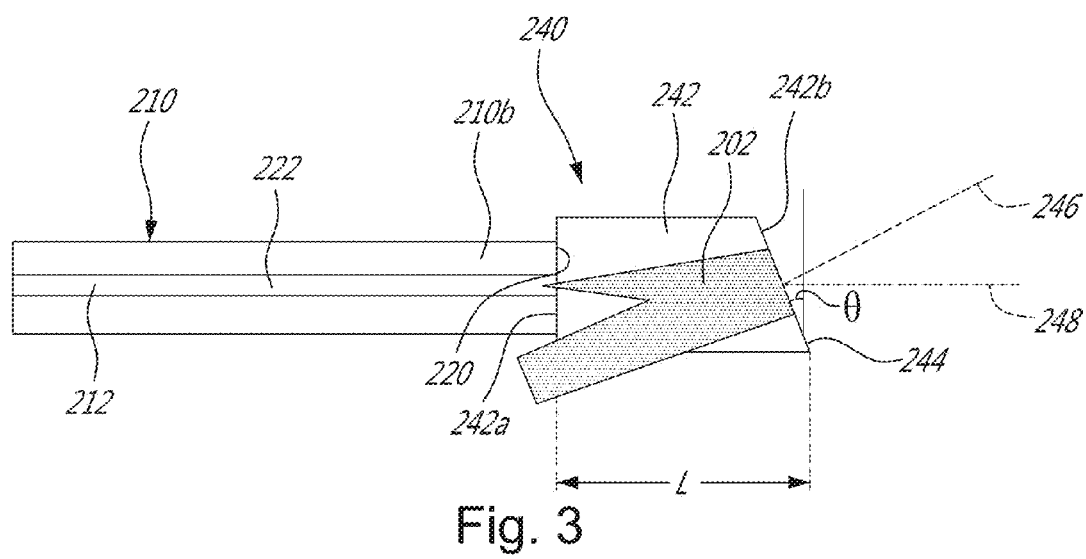
FIG. 3 is a schematic view of an example of an endcap provided at a second end of a length of fiber of a mid-infrared laser system, in accordance with an embodiment.

FIG. 3 shows a schematic view of another example of length of fiber 210 that can be used in a mid-infrared laser system similar to the mid-infrared laser system 100 described above with reference to FIG. 1. Unless stated otherwise, the embodiments described with reference to FIG. 1 also apply to the following embodiments. For instance, in the following embodiments, it is intended that the seed wavelength is not limited to be equal or above 2.5 μm.

In this specific embodiment, an endcap 240 is serially connected to the second end 210b of the length of fiber 210, although a similar endcap can also be connected to a first end of the length of fiber 210 (not shown in FIG. 3). The endcap 240 has a cylindrical waveguide 242 extending along a given length L, a first face 242a serially connected to the endface 220 of the second end 210b and a second face 242b which forms a glass-air interface 244.

In some embodiments, the endcap 240 is made of a material which is impermeable to OH— ions or less permeable to OH— ions than the low phonon energy glass of the length of fiber 210. In this way, the endcap 240 can protect the endface 220 of the second end 210b from undesirable chemical interactions with the surrounding environment. More specifically, it was found that, without the use of the endcap 240, the endface 220 can interact with the surrounding environment such that OH— ions can diffuse in the low phonon energy glass at the endface 220 and create impurities thereon. These impurities can then be absorbed by the mid-infrared laser beam 202 as it exits the second end 210b via the endface 220, which can lead to heating of the endface 220 and which, in turn, can cause OH— ions to diffuse more rapidly in the low phonon energy glass at the endface 220 and so forth. This cascade-like phenomenon can cause a degradation of the quality of the endface 220 of the second end 210b over a given period of time. Accordingly, it was found useful to provide the endcap 240 in a suitable material to prevent the degradation of the endface 220. For instance, the endcap 240 can include $AlF_3$, a material which was found to be less permeable to OH— ions than the low phonon energy glass of the length of fiber 210.

In this embodiment, the glass-air interface 244 has a normal 246 which is not parallel to a propagation axis 248 of the length of fiber 210, i.e. a non-null angle θ is formed between the normal 246 of the glass-air interface 244 and the propagation axis 248. The angle θ can be a few degrees, typically in the order of 3-5 degrees. By providing such a tilted glass air interface 244, a given percentage of the optical power of the seed laser beam will be reflected away from the length of fiber 210, which can significantly avoid the laser-active doped region 212 to lase within its gain bandwidth, a phenomenon usually referred to as "parasitic lasing". Indeed, in the context of the mid-infrared amplifier described herein, it was found that when the laser-active doped region 212 lases anywhere in the gain bandwidth of the laser-active doped region 212, a significant portion of the gain can be lost and thus negatively impact the generation of optical power where it is sought, i.e. at wavelengths longer than the seed wavelength. Accordingly, providing an endcap 240 at either or both ends of the length of fiber 210 was found useful.

It is noted that the cylindrical waveguide 242 can have either no core or a core larger than the core 222 of the length of fiber 210, and that the construction of the cylindrical waveguide 242, in combination with its length L, allows the mid-infrared laser beam 202 to diverge before reaching the glass-air interface 244. The endcap 240 is thus adapted to radially spread (i.e. diverge) the mid-infrared laser beam 202 as it propagates therealong. For a mid-infrared laser beam 202 having a given average power P, such a radial spreading will tend to increase the cross-sectional surface A of the mid-infrared laser beam 202 and decrease its intensity I (i.e. I=P/A) as it reaches the glass-air interface 244. Accordingly, using the endcap 240 can allow to increase the peak power of the mid-infrared laser beam without necessarily exceeding the damage intensity threshold of the glass-air interface 244 so that the mid-infrared laser beam can propagate outside the endcap 240 without damaging it.

Figure 4:
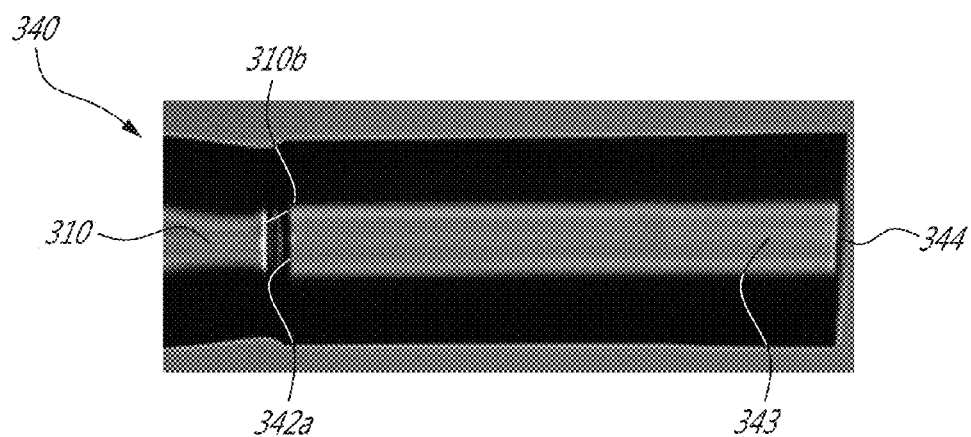
FIG. 4 is an image of another example of an endcap including a fiber segment directly fusion spliced to a second end of a length of fiber, in accordance with an embodiment.

FIG. 4 shows another example of an endcap 340, in accordance with an embodiment. In this example, the endcap 340 is provided in the form of a length of multimode fiber 343 which is fusion spliced to the length of fiber 310. More specifically, the first face 342a of the endcap 340 is fusion spliced to the second end 310b. In this case, the endcap 343 and the length of fiber 310 are made of different low phonon energy glasses. For instance, the endcap 340 is made of AlF3 and the length of fiber 310 is a singlemode fiber made of zirconium fluoride glass. In this example, angle-cleaving the glass-air interface 344 at a few degrees was found sufficient to prevent optical power to be undesirably reflected back to the seed laser.

Figure 5:
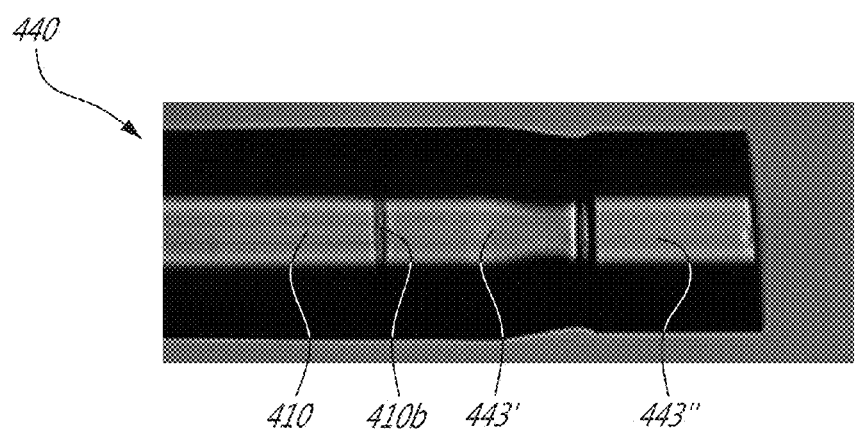
FIG. 5 is an image of another example of an endcap including two fiber segments made of different low phonon energy glasses, in accordance with an embodiment.

FIG. 5 shows another example of a endcap 440, in accordance with an embodiment. In this specific example, the endcap 440 includes a first multimode fiber segment 443' and a second multimode fiber segment 443". For instance, the first multimode fiber segment 443' can be made of zirconium fluoride glass and the second multimode fiber segment 443" can be made of AlF$_3$. To facilitate fusion splicing of the bandwidth gain reflector 440 to the second end 410b of the length of fiber 410, for instance to prevent bubble formation, the first multimode fiber segment 443' was first fusion spliced to the second end 410b and then the second multimode fiber segment 443" was fusion spliced to the first multimode fiber segment 443'. Using an intermediate medium such as the first multimode fiber segment 443' can be useful when two fiber segments having different geometries are to be fusion spliced to one another. Such an intermediate medium can be provided in the form of a thin film in other embodiments, for instance.

Figure 6:
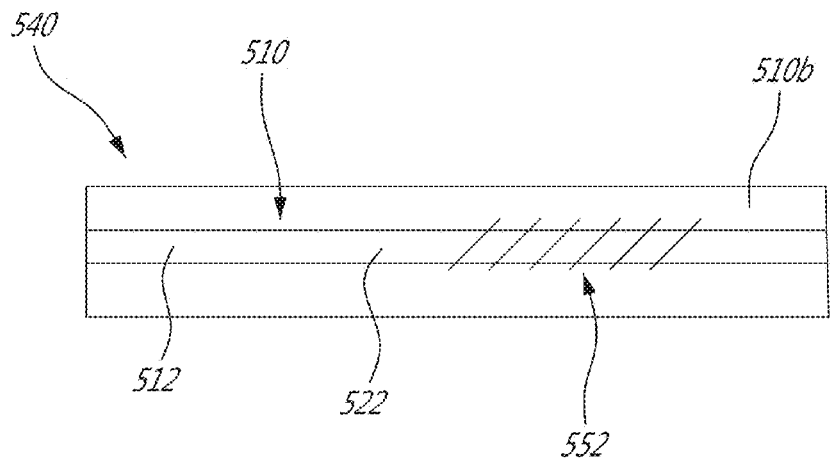
FIG. 6 is a schematic view of an example of a bandwidth gain reflector including a tilted Bragg grating inscribed proximate to a second end of a length of fiber, in accordance with an embodiment.

FIG. 6 shows another example of a bandwidth gain reflector 540, in accordance with an embodiment. In this specific example, the bandwidth gain reflector 540 is provided in the form of an tilted Bragg grating 552 inscribed in the core 522 of the length of fiber 510, proximate the second end 510b. The tilted Bragg grating 552 so inscribed is designed so as to reflect, outside the length of fiber 510, wavelengths ranging within a gain bandwidth of the laser-active doped region 512. As mentioned above, use of such a bandwidth gain reflector 540 can help avoiding the laser-active doped region 512 to lase at wavelengths ranging within a gain bandwidth of the laser-active doped region 512 and limiting the amount of power that can be generated at longer wavelengths.

Figure 7:
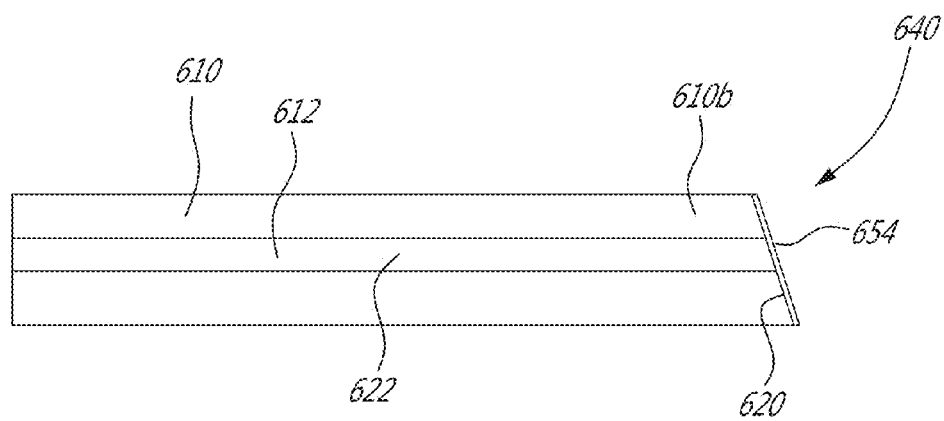
FIG. 7 is a schematic view of an example of a bandwidth gain reflector including a dichroic coating deposited on an endface of a second end of a length of fiber, in accordance with an embodiment.

FIG. 7 shows another example of a bandwidth gain reflector 640, in accordance with an embodiment. As depicted, the bandwidth gain reflector 640 is provided in the form of a dichroic coating 654 deposited on an angle-cleaved endface 620 of the second end 610b of the length of fiber 610. More specifically, the dichroic coating 654 is designed to be reflective at wavelengths within a gain bandwidth of the laser-active doped region 612 but optically transparent at longer wavelengths. Accordingly, any optical power at wavelengths within a gain bandwidth of the laser-active doped region 612 can be reflected outside the length of fiber 610 while the mid-infrared laser beam can exit the length of fiber 610 without undergoing substantial loss.

Figure 8:
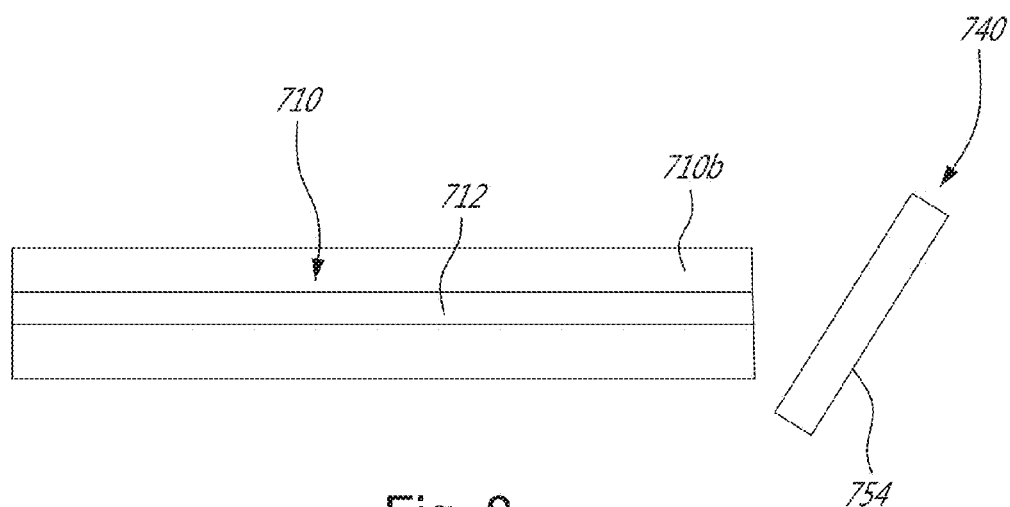
FIG. 8 is a schematic view of an example of a bandwidth gain reflector including a dichroic filter optically coupled to a second end of a length of fiber, in accordance with an embodiment.

FIG. 8 shows another example of a bandwidth gain reflector 740, in accordance with an embodiment. In this specific example, the bandwidth gain reflector 740 is provided in the form of a dichroic filter 754 optically coupled to the second end 710b of the length of fiber 710. Similarly to the dichroic coating 654 of FIG. 7, the dichroic filter 754 is designed to be reflective at wavelengths within a gain bandwidth of the laser-active doped region 712 but optically transparent at longer wavelengths. Accordingly, any optical power at wavelengths within a gain bandwidth of the laser-active doped region 712 can be reflected outside the length of fiber 710 while the mid-infrared laser beam can exit the length of fiber 710 without undergoing substantial loss.

On another note, it was found that the output optical spectrum of the mid-infrared laser beam is limited by the transmittance window of the low phonon energy glass of the length of fiber. For instance, if the transmittance window of the low phonon energy glass reaches 4.2 μm, the upper limit of the output optical spectrum of the mid-infrared laser beam is physically limited to 4.2 μm.

Figure 9:
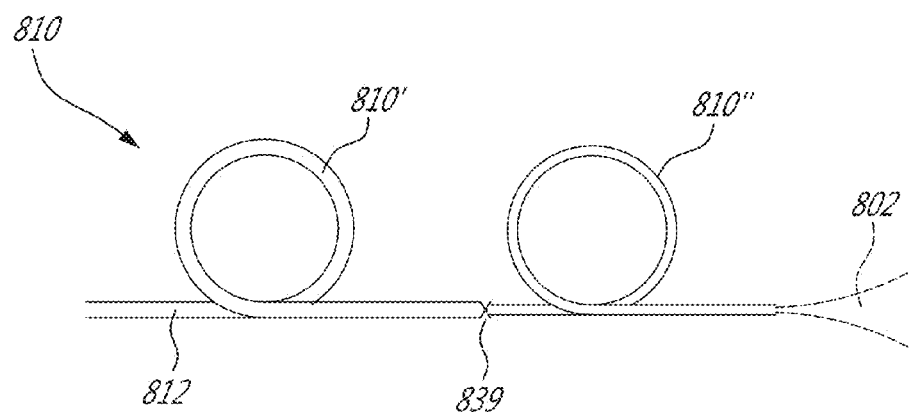
FIG. 9 is a schematic view of an example of a length of fiber including two fiber segments made of different low phonon energy glasses fusion spliced to one another, in accordance with an embodiment.

FIG. 9 shows another example of a length of fiber 810, in accordance with an embodiment. In this example, the length of fiber 810 includes an active fiber segment 810' made of a first low phonon energy glass fusion spliced, via a fusion splice 839, to a passive fiber segment 810" made of a second low phonon energy glass. As will be understood, the active fiber segment 810' includes the laser-active doped region 812 where optical amplification and generation of the mid-infrared laser beam 802 can occur. However, in this example, the second low phonon energy glass of the passive fiber segment 810" is chosen so as to exhibit a transmittance window which goes beyond the upper limit of the first low phonon energy glass of the active fiber segment 810'. By doing so, it was found that the mid-infrared laser beam 802 can be allowed to expand further towards longer wavelengths compared to embodiments where the passive fiber segment 810" is omitted or compared to embodiments where the length of fiber includes only one type of low phonon energy glass.

More specifically, in this embodiment, the first low phonon energy glass is a zirconium fluoride glass having a first transmittance window up to 4.2 μm and the second low phonon energy glass is indium fluoride having a second transmittance window up to 5.2 μm. Accordingly, a mid-infrared laser beam 702 having an output optical spectrum having power up to 5.2 μm can be achieved.

Figure 10:
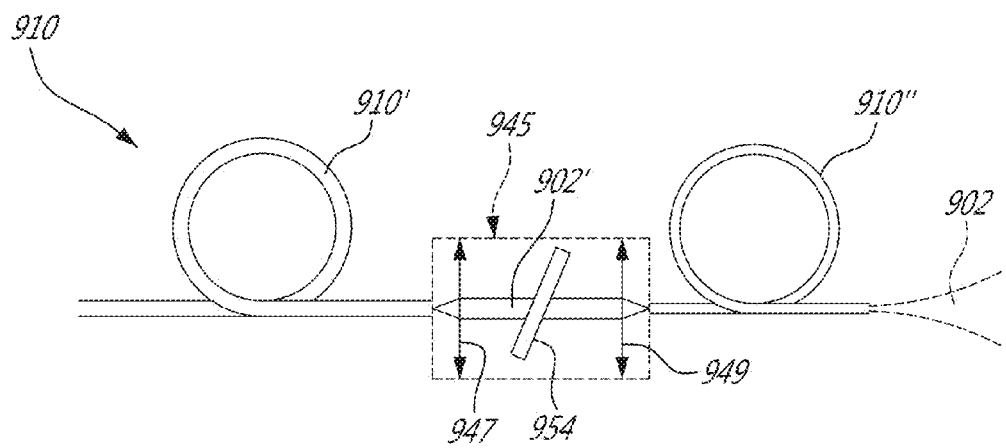
FIG. 10 is a schematic view of an example of a length of fiber including two fiber segments made of different low phonon energy glasses optically coupled to one another using a lens system, in accordance with an embodiment.

FIG. 10 shows another example of a length of fiber 910, in accordance with an embodiment. Similarly to the embodiment of FIG. 9, the length of fiber 910 has an active fiber segment 910' made of a first low phonon energy glass optically coupled to a passive fiber segment 910" made of a second low phonon energy glass. As shown, the active and passive fiber segments 910' and 910" are optically coupled to one another using a lens system 945. The lens system 945 includes a collimating lens 947 to collimate the mid-infrared laser beam 902' exiting from the active fiber segment 910' and an injection lens 949 to launch the mid-infrared laser beam 902' into the passive fiber segment 910". In this example, the lens system 945 can allow a dichroic filter 954 to be positioned in the path of the mid-infrared laser beam 902 and between the lenses 947 and 949 so as to remove optical power at desired wavelengths and act as a bandwidth gain reflector.

Figure 11:
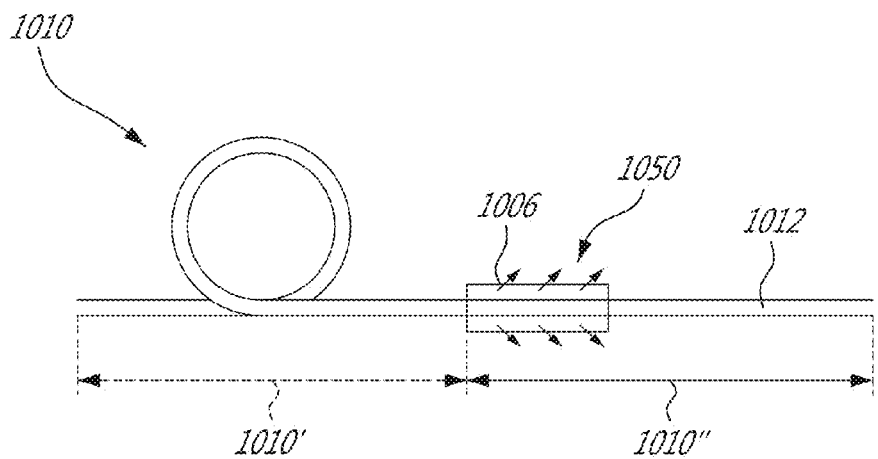
FIG. 11 is a schematic view of an example of a length of fiber including a pump stripper separating an active fiber segment from a passive fiber segment, in accordance with an embodiment.

FIG. 11 shows another example of a length of fiber 1010, in accordance with an embodiment. As depicted, the length of fiber 1010 includes a pump stripper 1050 provided at a given position along the length of fiber 1010 and adapted to flush out the pump laser beam 1006 away from the length of fiber 1010. By providing such a pump stripper 1050, the laser-active doped region 1012 of the length of fiber 1010 can be divided into an active fiber segment 1010' wherein optical amplification is allowed to occur and a passive fiber segment 1010" wherein no optical amplification is allowed to occur. Accordingly, the active fiber segment 1010' acts as an laser-active region for amplifying the seed laser beam while the passive fiber segment 1010" acts as a passive fiber to broaden and shift the mid-infrared laser beam further in the mid-infrared. The pump stripper 1050 allows the length of fiber 1010 to include both an active fiber segment and a passive fiber segment along without requiring a fusion splice, which can cause undesirable reflections and losses in the mid-infrared laser system. As can be understood, it is noted that, even though the passive fiber segment 1010" is made of a doped optical fiber, the absence of pumping in the passive fiber segments 1010" renders it optically transparent to the mid-infrared laser beam, as further described below.

EXAMPLE 1

In-Amplifier Mid-infrared Supercontinuum Generation

As reported in "Gauthier, Jean-Christophe, et al. "In-amplifier mid-infrared supercontinuum generation." Optics letters 40, 22 (2015): 5247-5250.", the inventors achieved mid-infrared supercontinuum generation from 2.6 to 4.1 µm in a single-mode erbium-doped fluoride glass fiber amplifier pumped at 976 nm and seeded by an OPG seed laser emitting 400 ps pulses at 2.75 µm wherein up to 82% of the supercontinuum power was generated beyond 3 µm.

This scientific publication describes a compact and convenient scheme for in-amplifier mid-infrared supercontinuum generation using a single-mode erbium-doped fluoride glass fiber pumped at 976 nm and seeded by a picosecond pulsed OPG source emitting around 2.75 µm. Under a low continuous wave (CW) pump power of 1.95 W at 976 nm, a broad output spectrum spanning from 2.6 to 4.1 µm is obtained with a maximum average output power of 78 mW and more than 80% of the output power above 3 µm. This demonstration represents a low-cost and efficient way to generate supercontinuum directly in the mid-infrared region around 3 µm. It is believed that this approach can be power-scaled and transposed to other amplification schemes to generate supercontinuum even further in the mid-infrared.

Figure 12:
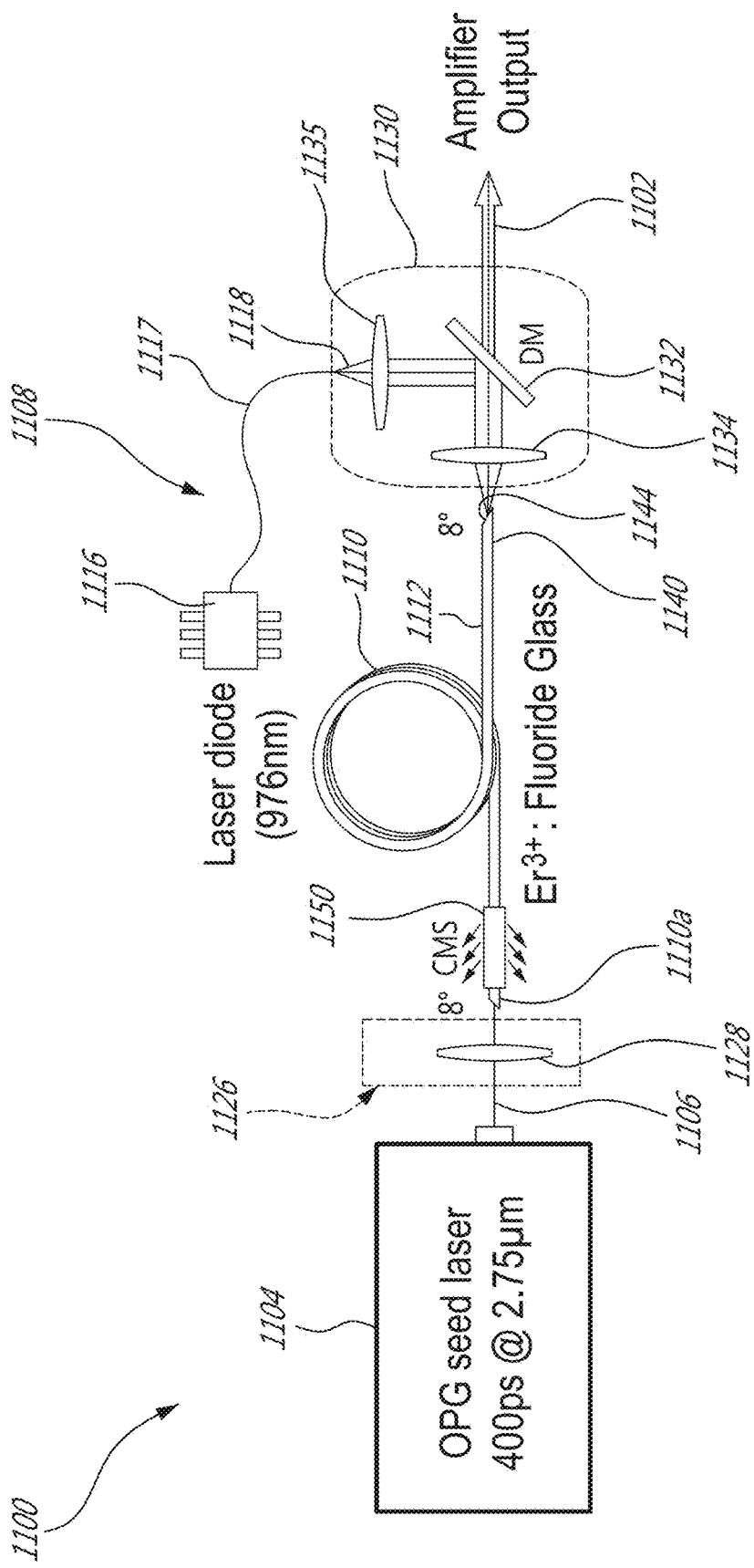
FIG. 12 is a schematic view of an example of a mid-infrared laser system configured in a contra-propagating pumping scheme, in accordance with an embodiment.

FIG. 12 shows a schematic view of an experimental mid-infrared laser system 1100, in accordance with an embodiment. The seed laser 1104 is an OPG source (model PIRL-VLP-2800, Light Matter Interaction Inc.) which simply includes a diode-pumped passively Q-switched micro-chip laser followed by a PPLN nonlinear crystal. It produces a seed laser pulsed beam 1106 with 400 ps pulses at a central wavelength of 2.75 µm and a repetition rate of 2 kHz. The average output power of the seed laser beam 1106 is fixed at 2 mW which corresponds to output pulses energy of 0.5 µJ. The seed laser beam 1106 is coupled into a length of fiber 1110 provided in the form of a low-loss (50 dB/km at 2.9 µm) single-mode $Er^{3+}$: ZrF4-based glass fiber (Le Verre Fluoré) through a seed injection assembly 1126 including a ZnSe aspheric lens 1128 (f=12.7 mm). The seed launching efficiency in the length of fiber 1110 was measured to be 15%. The length of fiber 1110 has a 7 mol % $Er^{3+}$-doped core with a diameter of 16 µm (NA=0.12), providing a single-mode operation at wavelengths above 2.5 µm. The core is surrounded by a 260 µm diameter cladding with a circular symmetry broken by two parallel flats separated by 240 µm to enhance the absorption of the pump laser beam 1118. A fluoroacrylate polymer of lower refractive index covers this cladding, enabling multimode propagation of the pump beam (NA>0.46). Based on its material composition and guidance properties, the estimated zero dispersion wavelength (ZDW) of the length of fiber 1110 is 1.65 µm ["Zhang, F. Gan, and P. Wang, Appl. Opt. 33, 50-56 (1994) ."]. The fiber amplifier 1108 is pumped in a contra-propagating pumping scheme using pump laser 1116 provided in the form of a fiber-coupled CW laser diode delivering a maximum average power of 6 W at 976 nm from a 105/125 µm, 0.15 NA multimode silica fiber 1117.

The pump laser beam 1118 is coupled into the length of fiber 1110 via a pump injection assembly 1130 including a ZnSe aspheric lens 1134 (f=12.7 mm) with an efficiency of 55% and the ZnSe aspheric lens 1134 is used to collimate the output amplified single-mode signal 1102. A pump collimating lens 1135 provided in the form of a silica lens is used. A homemade dichroic mirror (DM) 1132 having a high reflection at 980 nm and a high transmission for the 2800 nm amplified signal (R @ 980≥99%, T @ 2.8 µm≥90%) is placed between the lenses 1134 and 1135. A cladding mode stripper 1150 was fabricated by stripping a length of 4 cm of the first end 1110a and by recoating the stripped end with high index polymer (n=1.54) to evacuate the residual pump power.

An endcap 1140 made of a short segment (L≈700 µm) of 220/250 µm multimode fluoride glass fiber was spliced at the second end 1110b to avoid damaging the glass-air interface 1144 at high peak powers. Without such an endcap, the fiber damage threshold was reached at ~15 mW output power, corresponding to a peak intensity of about 5 $GW/cm^2$. With the 700 µm length endcap 1140 however, the peak intensity was reduced by a factor of 60 at the glass-air interface 1144. Photodegradation of the second end 1110b was not observed during the experiments and after several days of operation ["N. Caron, M. Bernier, D. Faucher, and R. Vallée, Opt. Express 20, 22188-22194 (2012)."]. Both fiber ends 1110a, 1110b were angled-cleaved at 8° to prevent parasitic CW lasing in the erbium-doped fiber 1110 at high pump powers.

The broadened output spectrum of the mid-infrared laser beam 1102 was measured for different pump powers using a scanning monochromator (Digikrom DK480). The monochromator, adjusted to a spectral resolution of 4 nm, was coupled to a liquid nitrogen-cooled InSb detector providing measurement capabilities up to a wavelength of 5.5 µm. A broadband AR-coated germanium window (not shown) was placed at the output of the amplifier 1108 to filter out the residual signal below 1.8 µm. The average power of the output signal was monitored with a low power thermopile detector (Gentec EO, XLP12-3S-H2).

In the experiment, three lengths of laser-active doped regions 1112 (0.9 m, 2.0 m and 5.6 m) were provided as described above and tested under different pumping powers. The resulting output spectra at different launched pump powers are shown in FIGS. 13A-C.

Figure 13A:
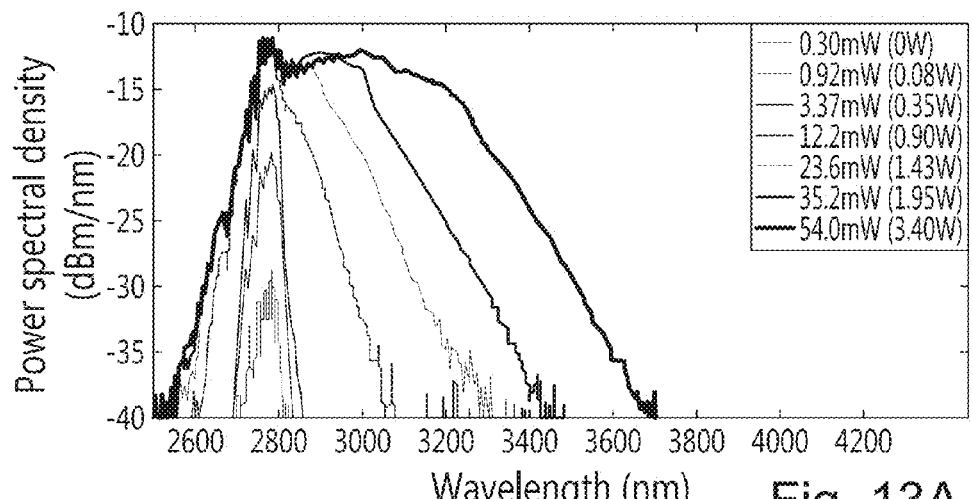
FIGS. 13A-C are graphs showing example output optical spectra obtained using the mid-infrared laser system of FIG. 12 when operated with different pump powers, for three different lengths of fiber, in accordance with an embodiment.

FIG. 13A shows the results for the 0.9 m long laser-active doped region, in accordance with this experiment. It can be observed that at low pump powers (below approximately 0.8 W), the seed laser beam is amplified without showing significant spectral broadening. At pump powers beyond 0.8 W, the additional pump provided broadens the spectrum up to about 3500 nm at the maximum pump power available (3.4 W). A maximum output power of 54 mW is obtained, thus corresponding to an amplifier conversion efficiency of 1.7% (17 mW/W) according to the launched pump power. The net amplifier gain is ~22 dB at this pump level.

Figure 13B:
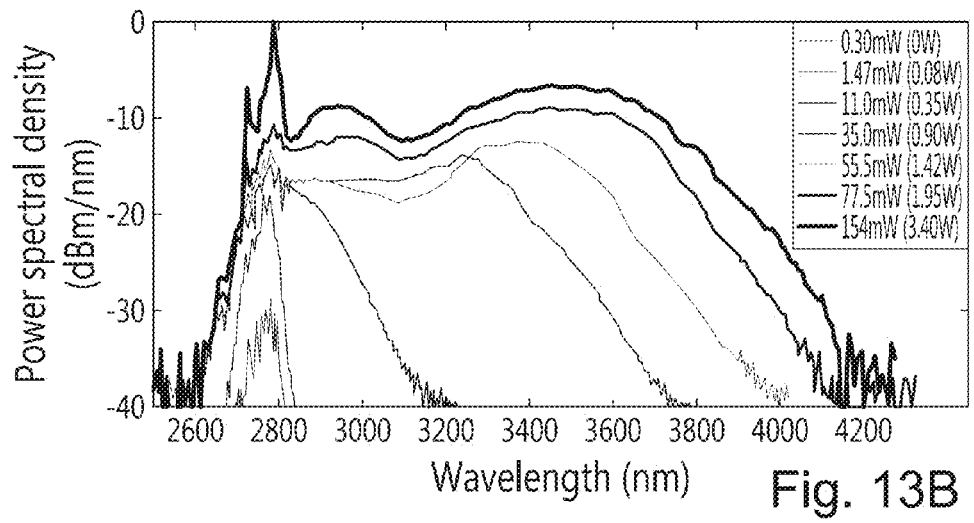

FIG. 13B shows the results for the 2.0 m long laser-active doped region 812, in accordance with this experiment. As can be seen, when the length of the laser-active doped region 1112 is increased to 2.0 m, a significantly broader supercontinuum extending from 2.6 to 4.1 µm is obtained with a maximum average output power of 154 mW. The amplifier conversion efficiency also increases to 4.5% (45 mW/W) according to the launched pump power. A relatively good supercontinuum spectral flatness is observed, with a spectral variation of less than 6 dB over 1000 nm (from 2.74 to 3.74 µm) for the 77.5 mW output power curve. One also notes that for the 154 mW output power curve, a CW laser emission peak is observed at 2.78 µm on top of the supercontinuum signal. Such parasitic CW emission, observed with a pump power threshold of ~2.2 W, prevents any further amplification of the seed pulses.

Figure 13C:
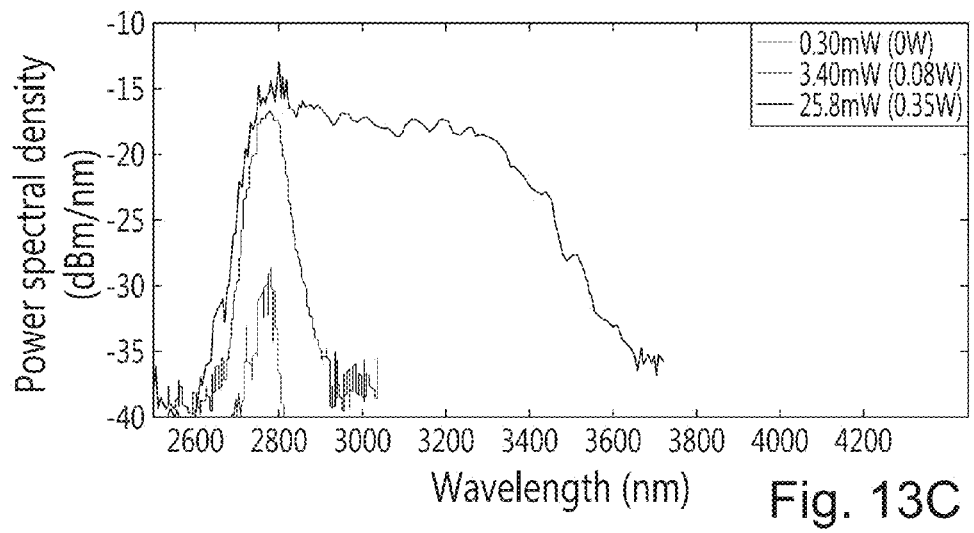

FIG. 13C shows the results for the 5.6 m long laser-active doped region 1112, in accordance with this experiment. For the longest fiber length of 5.6 m, an improved efficiency of 7.5% (75 mW/W) was obtained and the output spectrum of the mid-infrared laser beam 1102 broadened at much lower pump powers. However, parasitic CW lasing also occurred much sooner (at about 0.4 W), limiting the maximum supercontinuum output power to less than 30 mW.

For all fiber lengths, the supercontinuum of the mid-infrared laser beam 1102 is generated asymmetrically, i.e. almost exclusively towards the longer wavelengths. This behavior is expected since the seed wavelength (2.75 µm) is far above the 1.65 µm ZDW of the length of fiber 1110, thus enabling supercontinuum generation well inside the anomalous dispersion regime. In such regime, the incident high-peak-power pulse is expected to break up into multiple shorter pulses by modulation instabilities which are then shifted to longer wavelengths through Raman-induced self-frequency shift ["J. Dudley, G. Genty, and S. Coen, Rev. Mod. Phys. 78, 1135 (2006)."]. The large gain provided here to the pulse may however affect this standard scenario. Modeling of the supercontinuum generation process in an amplifying low-loss medium is therefore required to fully understand and optimize the actual broadening process.

Figure 14:
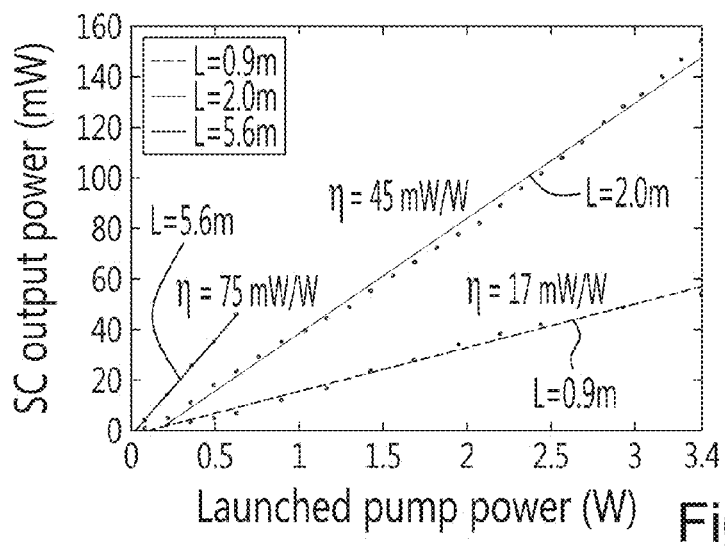
FIG. 14 is a graph showing example average power of mid-infrared laser beams as a function of the pump power for the three different lengths of fiber, in accordance with an embodiment.
Figure 15:
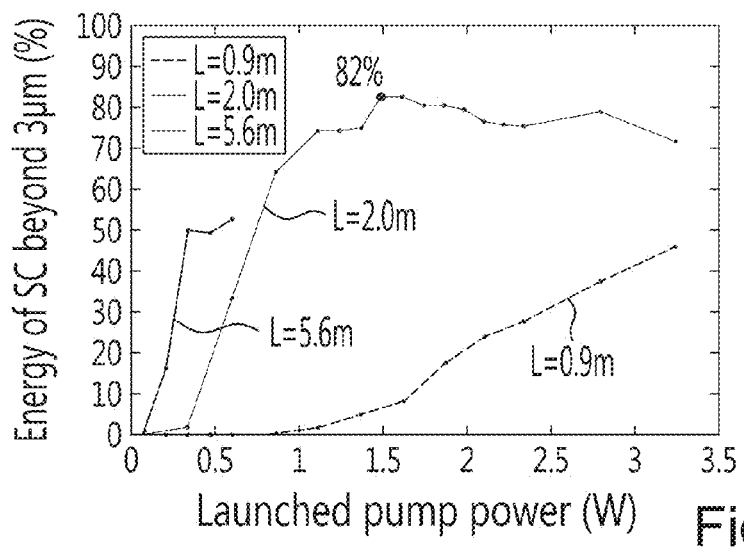
FIG. 15 is a graph showing energy percentage of optical power generated above 3.0 µm with increasing pump power for the three different lengths of fiber, in accordance with an embodiment.

In order to compare the efficiency of the laser amplifier as a function of the fiber length, the output power of the amplifier 1108 as a function of the launched pump power was computed, the results of which are shown in FIG. 14. As expected, the efficiency increases with longer amplifier lengths: from 1.7% at 0.9 m to 7.5% at 5.6 m. This behavior can be partly explained by the low cladding absorption coefficient at 976 nm (~3 dB/m), resulting in a pump absorption of less than 50% in the 0.9 m fiber and of about 98% in the 5.6 m fiber. However, even for the longest fiber length of 5.6 m for which the pump absorption is maximal, the amplifier efficiency is still quite low compared to the 30% laser efficiency obtained with the same fiber under optimized CW laser operation ["D. Faucher, M. Bernier, G. Androz, N. Caron and R. Vallée, Opt. Letters 36, 1104-1106 (2011)."].

To evaluate the supercontinuum generation efficiency as a function of both fiber length and pump power, the percentage of supercontinuum energy beyond 3 µm as a function of pump power for the three amplifier lengths was computed using a spectral density overlap integral. The results of this computation are shown in FIG. 115.

In this specific experiment, the best results in terms of supercontinuum generation above 3 µm are obtained for the fiber length of 2.0 m. In this case, as the launched pump power is increased beyond 1 W, the supercontinuum energy above 3 µm exceeds 70% of the total output power and reaches a maximum of 82% at 1.5 W of pump power. This percentage tends to slowly decrease at higher pump powers as the CW laser buildup with a threshold of about 2.2 W. For the 5.6 m fiber length, a low CW lasing threshold of about 0.4 W limits the percentage of energy converted beyond 3 µm to about 50%.

Figure 16:
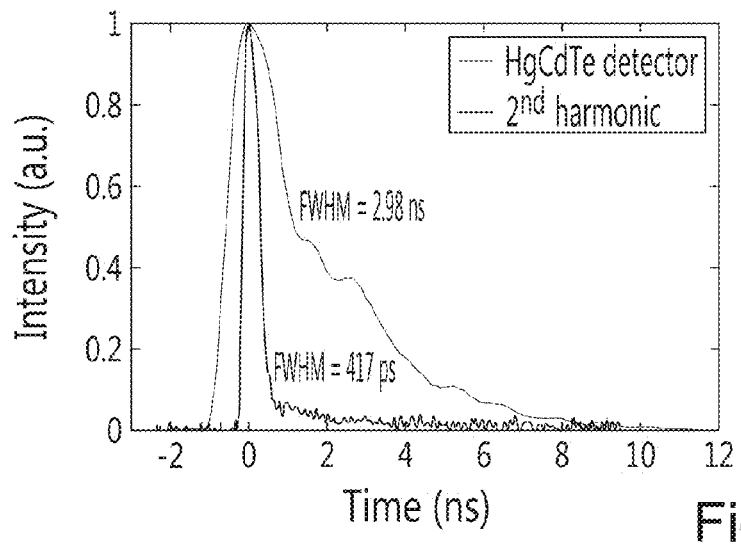
FIG. 16 is a graph showing temporal profile of pulses of the mid-infrared laser beam using two different detectors, in accordance with an embodiment.

The temporal profile of the amplified pulses of the mid-infrared laser beam 1102 was then characterized with a nitrogen-cooled HgCdTe photodiode (Kolmar Technologies, rise time<2 ns). An InGaAs ultrafast photodetector (Alpha-Las, rise time<100 ps) was also used to characterize the pulses from its second harmonic (SH), since ultrafast photodetectors with a rise time below 1 ns are not commercially available around 3 µm. The SH signal is generated by focusing the mid-infrared laser beam 1102 into a Barium borate (BBO) nonlinear crystal. FIG. 16 presents the temporal pulse profile measured with both detectors for the 2.0 m fiber length and an output power of 77.5 mW. The SH generation output pulse duration is measured to be 417 ps at FWHM. Assuming a Gaussian pulse shape, a pulse duration of 586 ps was retrieved from the SH signal, which is slightly higher than the 400 ps seed pulses duration retrieved in the same manner using the same SH setup.

Different ways could be explored to optimize the wavelength coverage of the SC. One of the main limiting factor is the design of the gain fiber which was originally optimized for laser operation at 2.8 µm with a single-mode cutoff wavelength of 2.5 µm and a low NA of 0.12. Under such design, the weak confinement of the fundamental mode (i.e. 674 µm$^2$ at 4 µm compared to 317.4 µm$^2$ at 3 µm) significantly hinders spectral broadening beyond 4.2 µm. Another limiting factor is the high material loss of the ZrF4 fiber ($\alpha \geq 1$ dB/m at $\lambda \geq 4.2$ µm) as the output spectrum is broadened close to the material transparency limit. This problem may be overcome by launching the amplified pulses in a mid-infrared glass fiber, such as the recently available low-loss InF$_3$ ["F. Théberge, J.-F. Daigle, D. Vincent, P. Mathieu, J. Fortin, B. E. Schmidt, F. Légaré, Opt. Lett. 38, 4683-4685 (2013)."] and ChG ["A. M. Heidt, J. H. V. Price, C. Baskiotis, J. S. Feehan, Z. Li, S. U. Alam, and D. J. Richardson, Opt. Express 21, 24281-24287 (2013)."] fibers, to broaden further their output spectrum. ChG glass fibers are of particular interest since the long wavelength side of the supercontinuum generated in-amplifier approaches the ZDW of As2S3 and As2Se3, the most matures ChG glasses for fiber fabrication. In a long term perspective, doping such mid-infrared glasses with appropriate rare-earth ions (as recently reported ["A. Berrou, C. Kieleck, and M. Eichhorn, Opt. Lett. 40, 1699-1701 (2015).", "A. Galstyan, S. H. Messaddeq, V. Fortin, I. Skripachev, R. Vallée, T. Galstian, and Y. Messaddeq, Optical Materials 47, 518-523 (2015)."])

could allow to transpose the obtained results to other in-amplifier schemes operating at longer wavelengths in the mid-infrared.

It is assumed possible to scale the average output power of the supercontinuum by increasing the seed repetition rate while keeping a similar peak power. In fact, seed sources at 2.75 μm with repetition rates in the tens of kHz are already commercially available (from Light Matter Interaction Inc., for instance). The watt regime should be readily obtained in this manner. A higher amplifier efficiency (and thus a higher output power) is also expected by selecting a longer fiber (see FIG. 14), provided the parasitic CW emission can be prevented using, for instance, bandwidth gain reflectors. Its threshold could be pushed away in different ways, particularly by reducing feedback and/or synchronously pumping in pulsed regime.

In summary, in this experiment, a simple and low-cost scheme for mid-infrared supercontinuum generation by directly seeding an erbium-doped fluoride glass fiber with an OPG source delivering 400 ps pulses at 2.75 μm was presented. A supercontinuum extending from 2.6 to 4.1 μm with up to 82% of its energy above 3 μm was achieved. Further spectral broadening is expected with optimized fiber geometry and composition. In addition, this demonstration could be easily transposed to other types of rare-earth fiber amplifiers to target different portion of the mid-infrared spectrum.

EXAMPLE 2

Watt-Level Fiber-Based Mid-infrared Laser System Tunable from 2.8 to 3.6 μm

The following paragraphs describe a simple and efficient mid-infrared laser system 1200. As will be described, the mid-infrared laser system 1200 can be used to generate a mid-infrared laser beam 1202 with spectral features tunable from 2.8 μm to 3.6 μm at a relatively high average output power. For instance, stable 160-fs pulses at 3.4 μm with a maximum energy of 37 nJ, a corresponding average output power above 2 W and an estimated peak power above 200-kW were obtained.

In the mid-infrared, low phonon energy glass such as fluoride glass fibers generally present anomalous dispersion ($\beta_2 < 0$), forcing laser systems to operate in the soliton regime. This regime has proven to limit the duration, energy and peak power of the generated pulses in the near-IR ["K. Tamura, L. E. Nelson, H. A. Haus, and E. P. Ippen, Appl. Phys. Lett. 64, 149 (1994)"]. However, since the fundamental soliton energy is given by: $E_s = \lambda |\beta_2| A_{eff}/(\pi \tau_0 n_2)$ ($\tau_0$: pulse width, $n_2$: nonlinear refractive index, $A_{eff}$: Effective mode area, scaling as $\lambda^2$), meaning the energy scales as $\lambda^3$, significant improvements can be expected in terms of output pulse energy as one shifts further into the mid-infrared ["G. P. Agrawal, Nonlinear Fiber Optics, 5th ed. (Academic, 2012)"].

The anomalous dispersion regime can also be instrumental for controlling the central wavelength of the pulses through the process known as soliton self-frequency shift (SSFS) ["J. P. Gordon, Opt. Lett. 11, 662 (1986)", "F. M. Mitschke, and L. F. Mollenauer, Opt. Lett. 11, 659 (1986)"]. The use of low phonon energy glass fibers seems promising for efficiently reaching the 3-5 μm band through SSFS as these fibers possess a relatively low nonlinear refractive index and large anomalous dispersion.

For instance, a soliton shift up to 4.3 μm in an indium-fluoride glass fiber was recently obtained by Tang et al. ["Y. Tang, L. G. Wright, K. Charan, T. Wang, C. Xu, and F. W. Wse, Optica 3, 948 (2016)"] using a 1.9-μm fiber laser system as the pump source. However, the lack of efficient mid-infrared femtosecond laser sources in these previous experiments implies the use of microstructured fibers or complex high-power conventional laser systems operating in the near-infrared in order to produce a spectral shift reaching the mid-infrared. Moreover, these shifts are generally associated with the generation of dispersive waves or secondary solitons as well as losses through the SSFS process that reduces significantly the energy transfer into the mid-infrared and thus limits the power scalability of these conventional systems.

To demonstrate the potential of the SSFS approach for the generation of optical power in the mid-infrared, the mid-infrared laser system 1200 is provided with an ultrafast seed fiber laser 1204 followed by a fiber amplifier 1208 both operated at 2.8 μm. As will be described, the mid-infrared laser system 1200, which relies solely on the use of erbium-doped zirconium fluoride fibers, allows for the generation of stable sub-250-fs solitons with energy and estimated peak power up to 37 nJ and 212 kW, respectively. More than 45% of the output spectral power lies within the main shifted soliton, corresponding to an average output power of up to 2 W above 3.2 μm, a 20-fold improvement over previous SSFS demonstrations in terms of average power.

Figure 17:
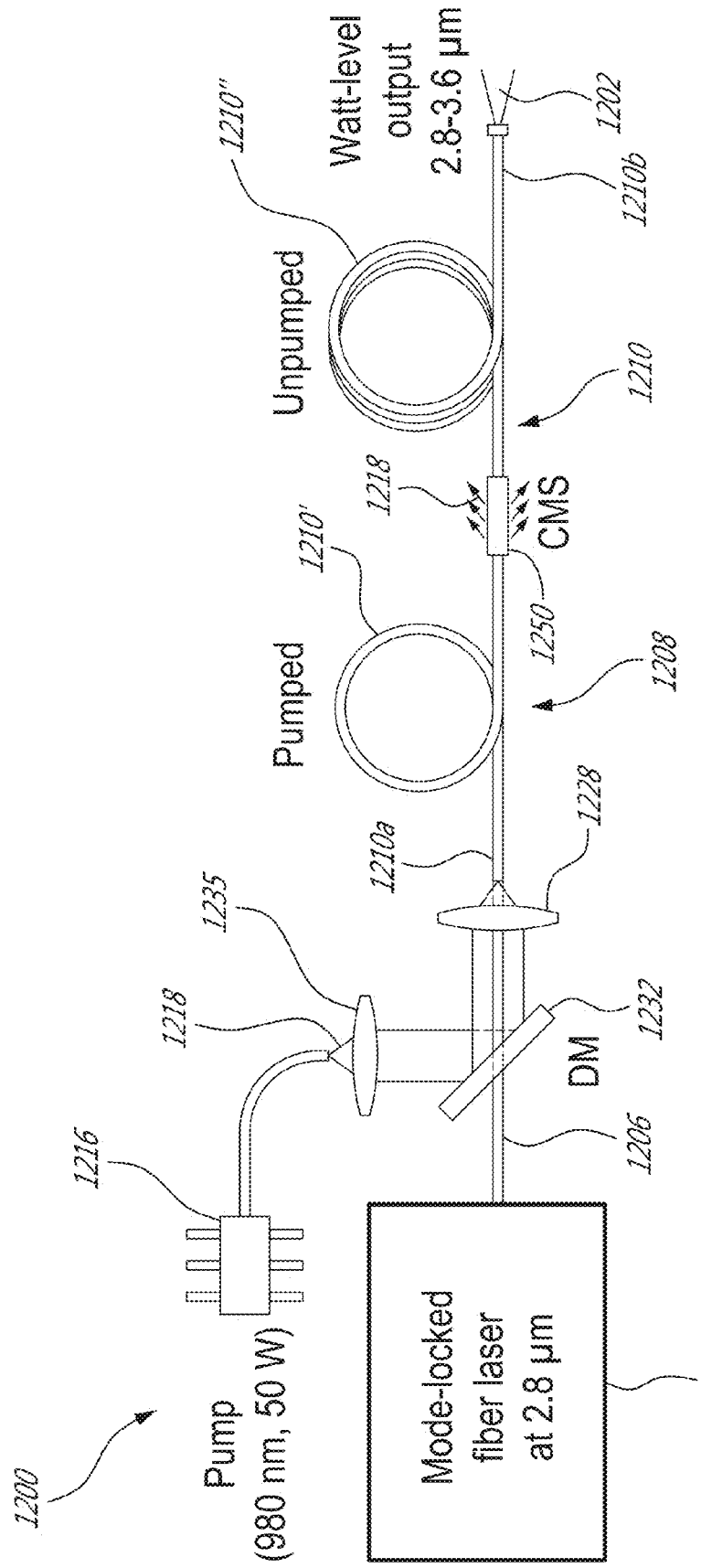
FIG. 17 is a schematic view of another example of a mid-infrared laser system having a single length of fiber divided into an active fiber segment and a passive fiber segment via a pump stripper, in accordance with an embodiment.

A schematic view of the mid-infrared laser system 1200 is illustrated in FIG. 17. In this example, a co-directional (forward) pumping scheme was selected. Indeed, both seed and pump beams 1206,1218 are coupled in the active fiber segment 1210' through a ZnSe aspheric lens 1228. As depicted, the pump laser beam 1218 is collimated using a pump collimating lens 1235 and then reflected towards the active fiber segment 1210' using a dichroic surface 1232.

In this example, the ultrafast seed fiber laser 1204 is provided in the form of a fiber ring oscillator mode-locked by nonlinear polarization evolution (NPE) similar to the one presented in "S. Duval, M. Olivier, V. Fortin, M. Bernier, M. Piché, R. Vallée, Proc. SPIE 9728, 972802 (2016)". The ultrafast seed fiber laser 1204 includes a 3-m fiber long cavity and a 65% output coupling ratio in the cavity to ensure a self-starting operation of the laser 1204. The seed laser beam 1206 includes 440-fs pulses having 4.7-nJ per pulse with a peak power of 9.5 kW generate at a repetition rate of 57.9 MHz. An optical isolator can be used to prevent backward reflections in the amplifier 1208 from destabilizing the ultrafast seed fiber laser 1204.

In the amplifier 1208, the gain is provided by a length of fiber 1210 provided in the form of a double-clad zirconium fluoride fiber (Le Verre Fluoré). More specifically, the length of fiber 1210 consists of a 7% mol. erbium-doped core (ø=15 μm, NA=0.12) surrounded by a truncated 260-μm diameter inner cladding (NA>0.46) that guides the pump laser beam 1218. In this example, the length of fiber 1210 is pumped via one or more CW multimode laser diodes 1216 providing 50 W for the amplifier 1208.

The amplifier 1208 was first tested with different lengths of fiber 1210. Each length of fiber 1210 is angle-cleaved (~4°) at its first end 1210a and is terminated, at its second end 1210b, by an angle-cleaved endcap to prevent the fiber tips from degradation at high average and peak powers ["N. Caron, M. Bernier, D. Faucher, and R. Vallée, Opt. Express 20, 22188 (2012)"] and also to avoid early CW lasing in the amplifier 1208 by reducing the feedback.

A pump stripper 1250 is provided at a given position along the length of fiber 1210 to remove a remaining power of the pump laser beam 1218, thus dividing the length of fiber 1210 into a pumped, active fiber segment 1210' and an unpumped, passive fiber segment 1210". More specifically, the active fiber segment 1210' is used to provide gain to the mid-infrared laser beam while the passive fiber segment 1210" is used to shift the output optical spectrum of the mid-infrared laser beam further into the mid-infrared.

Figure 18:
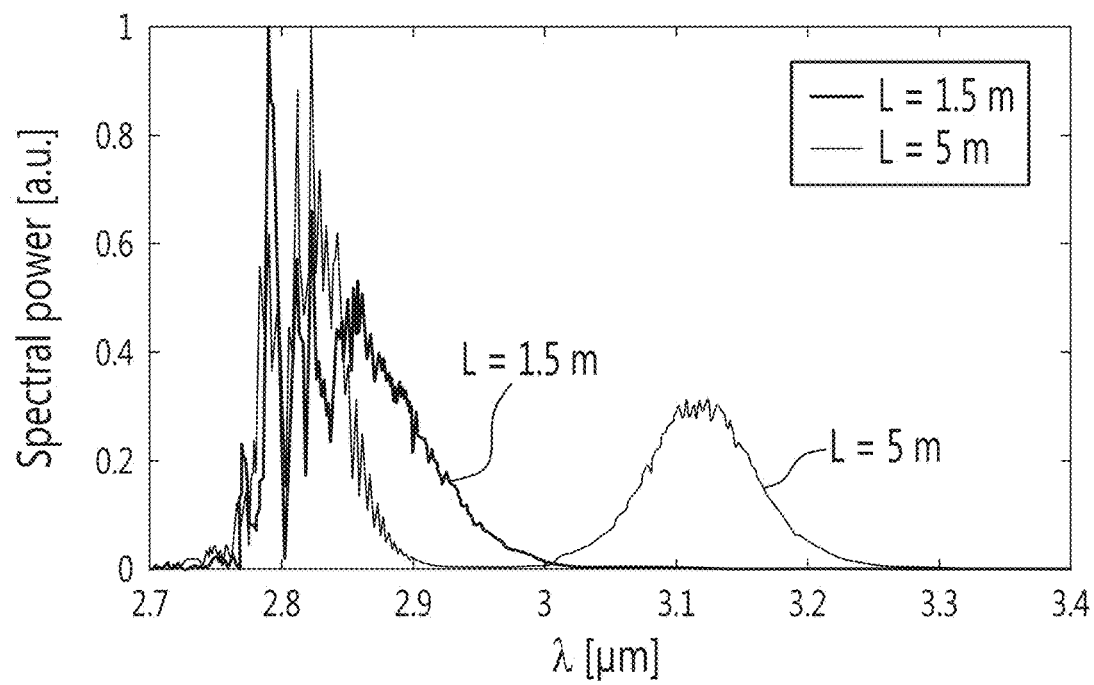
FIG. 18 is a graph showing output optical spectra of mid-infrared laser beams obtained with the mid-infrared laser system of FIG. 17 with two different lengths of the active fiber segment, in accordance with an embodiment.
Figure 18A:
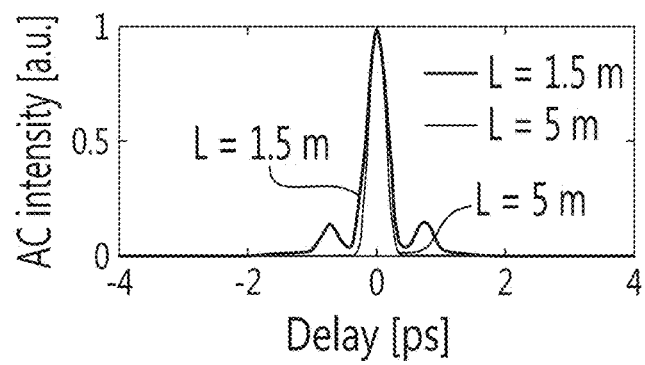
FIG. 18A is a graph showing temporal pulse profiles, measured using an intensity autocorrelator, corresponding to the output optical spectra shown in FIG. 18, in accordance with an embodiment.

FIG. 18 compares the resulting output optical spectra and autocorrelation traces for a mid-infrared laser beam having an average power of ~2.4 W, obtained using an active fiber segment 1210' having a length of 1.5 m and 5 m, respectively. The spectra were obtained using a commercial optical spectrum analyzer that covers the wavelength range from 1.5 to 3.4 µm (Yokogawa, AQ6376). In the case of the 5-m long active fiber segment 1210', the main soliton is Raman-shifted out of the gain bandwidth during propagation, causing the non-shifted residual background to be amplified in the remaining section of the amplifier. For the 1.5-m long active fiber segment 1210', although more pump power is needed to obtain a similar output average power, most of the available power is transferred to the soliton as it remains within the erbium gain bandwidth during its propagation through the amplifier. A shorter amplifier length can thus allow for a more efficient amplification of the main pulse while also increasing the CW lasing threshold. FIG. 18A presents the corresponding autocorrelation traces obtained from a commercial intensity autocorrelator (Femtochrome FR-103XL). The small sidelobes observed for the 1.5-m long active fiber segment 1210' indicates that the main soliton could not be amplified any further, giving rise to an amplification of the small pedestal accompanying the main pulse ["G. P. Agrawal, Phys. Rev. A 44, 7493 (1991)"]. Nevertheless, both the 1.5 m long and the 5 m long active fiber segments 1210' can result in the generation of ~200-fs pulses. Assuming that most of the output energy (~35 nJ) is in the main soliton for the 1.5-m amplifier, this can correspond to an estimated peak power of 150 kW at a central wavelength of 2.85 µm.

In order to efficiently convert most of the energy in the main soliton and maximize its shift toward longer wavelengths, it was found convenient to position the pump stripper 1250 after the first 1.25 m of the length of fiber 1210. As mentioned above, the pumped fiber segment 1210' acts as a short amplifier for the soliton pulses while the remaining unpumped fiber segment 1210" acts as a passive fiber to shift the amplified soliton further into the mid-infrared. Since the 2.8-µm laser transition of erbium involves the $^4I_{11/2}$ and $^4I_{13/2}$ excited states, there is no absorption of the signal by erbium-ions in the absence of a pump. This approach greatly reduces the complexity and the losses of the system as it does not require any splice between the active and the passive single mode fibers. As in the previous case, the fiber is terminated by an $ALF_3$ endcap (L=600 µm, angle=3°).

Figure 19A:
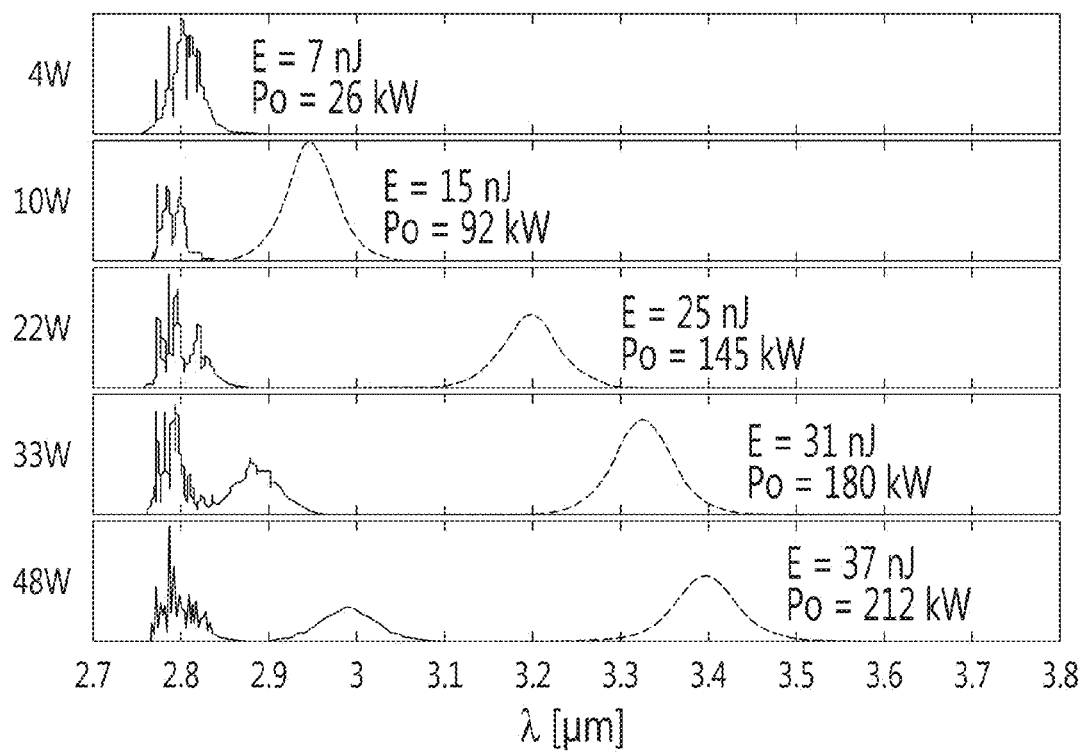
FIGS. 19A-B are graphs including output optical spectra of mid-infrared laser beams obtained using the mid-infrared laser system of FIG. 17 with two different lengths of fiber when operated with different pump powers, in accordance with an embodiment.
Figure 19B:
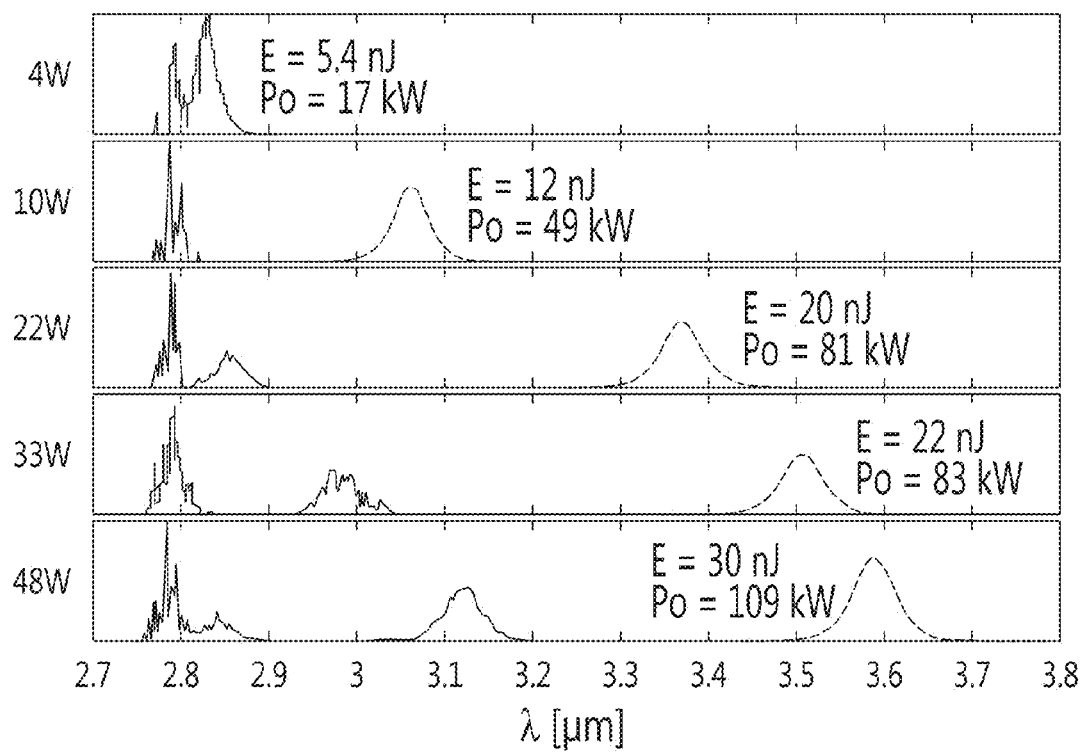

FIGS. 19A-B present the normalized output spectra as a function of the incident pump power in the active fiber segment 1210'. Two different lengts for the length of fiber 1210 were tested (L=8 m and 22 m), both having an active fiber segment 1210' of 1.25 m. The output optical spectra were taken using a scanning monochromator (Digikrom DK480) with a 0.4-nm resolution. The monochromator was coupled to a nitrogen-cooled InSb detector with high sensitivity up to 5.5 µm. The output optical spectra were corrected according to the spectral response of the characterization setup calibrated using a black body emitter as a reference source. As the pump power is increased, it can be seen that a spectral feature such as a soliton continuously shifts toward longer wavelengths in the passive fiber segment 1210", reaching a maximum central wavelength of 3.4 µm in the 8-m long length of fiber 1210 and 3.59 µm in the 22-m long length of fiber 1210. For high pump powers (>20 W), the main soliton shift begins to slow down and a fraction of the amplifier gain is given to the residual background, giving rise to a second noisier soliton that is further shifted in the unpumped fiber length.

Figure 20:
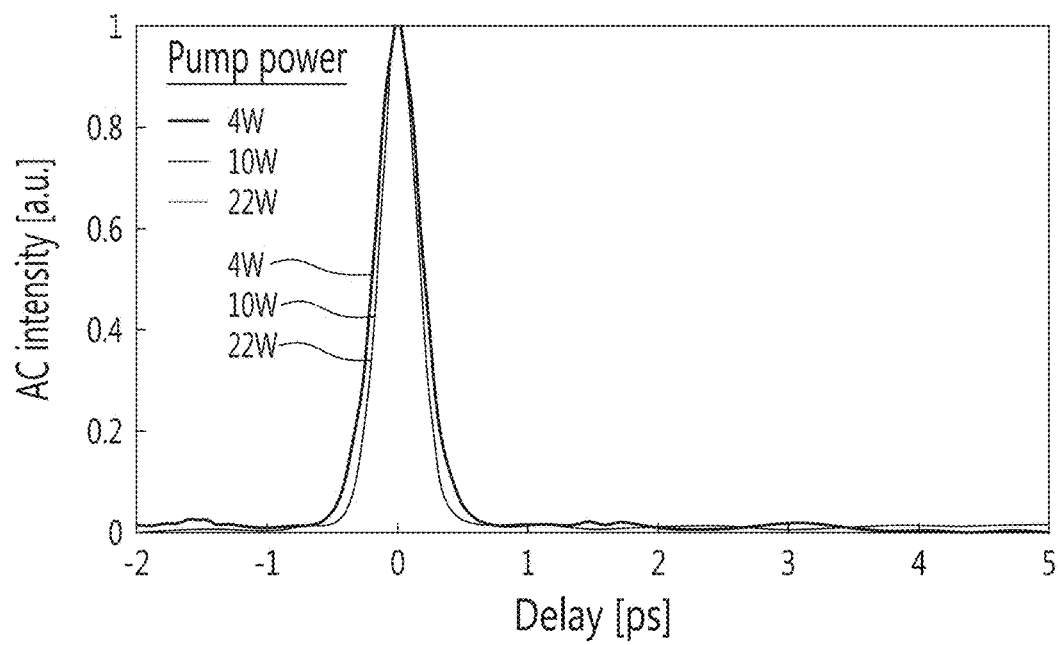
FIG. 20 is a graph showing autocorrelation traces associated with three of the output optical spectra shown in FIG. 19B, in accordance with an embodiment.
Figure 20A:
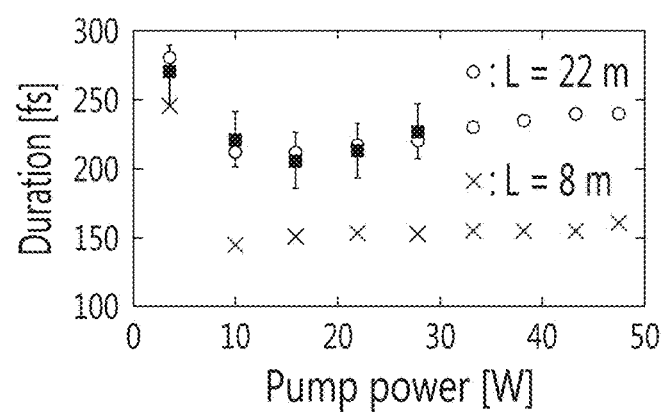
FIG. 20A is a graph showing the evolution of pulse duration as a function of the pump power for two different lengths of fiber, in accordance with an embodiment.

The autocorrelation (AC) traces of the main shifted soliton corresponding to the first three output optical spectra of FIG. 19B for the 22-m system are presented in FIG. 20. The AC traces were only measured for low pump powers (>30 W) as the detector's sensitivity rapidly decreases once the main soliton is shifted above 3.2 µm. Moreover, the error on the pulse duration inferred from the AC trace was evaluated to be of the order of ±20 fs. On the other hand, the pulse duration of the main soliton for all pump powers can be evaluated with a good accuracy simply from the output spectra. The corresponding spectra of the isolated solitons at longer wavelengths fit with the transform-limited spectra of ideal sech-shape pulses (see FIGS. 19A-B). FIG. 20A shows the calculated pulse duration from the spectra for both fiber lengths. The durations obtained from the spectra with the 22-m fiber (see circles) are also compared on the same graph with those inferred from the AC traces at low pump power (see squares). From FIG. 20A, it can be seen that the pulse duration of the main soliton slightly increases as it shifts towards longer wavelengths.

Figure 21:
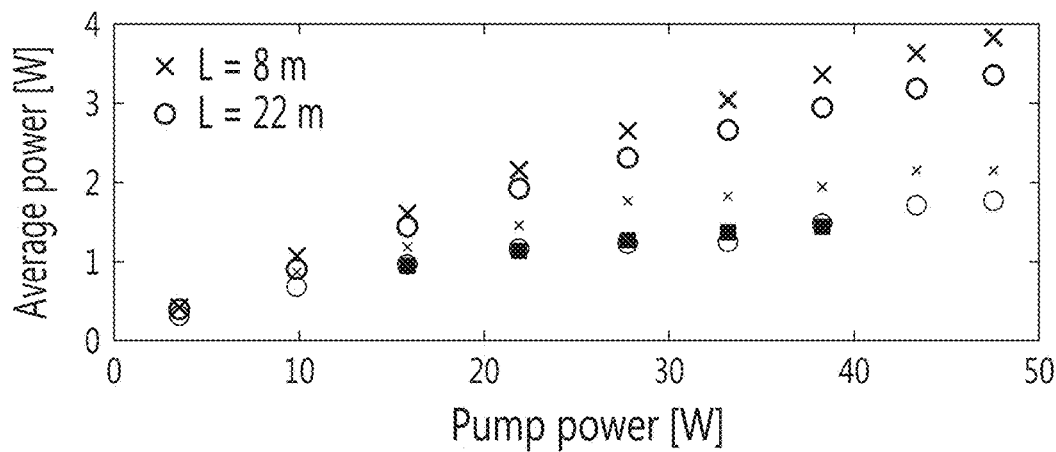
FIG. 21 is a graph showing average power of mid-infrared laser beams as function of pump power using the mid-infrared laser system of FIG. 17 with the two different lengths of fiber, in accordance with an embodiment.

The total output power as a function of the incident pump power is shown in FIG. 21 for both fiber lengths (above the dashed line). The average power contained within the main soliton was estimated from the spectra and is also displayed in FIG. 21 (below the dashed line). For the 22-m fiber, these values were verified with a direct measurement of the average power within the main soliton using a long-pass filter at 3.2 µm. These measurements were only valid up to a certain range of pump powers, i.e. when only the main soliton is transmitted through the filter. Over the whole tuning range, more than 45% of the total energy was still contained within the main amplified soliton. In the case of the 8-m fiber, the average power in the 3.4-µm soliton is 2.1 W, which actually surpasses the highest average power reported so far from a CW fiber laser around 3.4 µm ["V. Fortin, F. Maes, M. Bernier, S. T. Bah, M. D'Auteuil, and R. Vallée, Opt. Lett. 41, 559 (2016)"]. A clean soliton at 3.6 µm with an average power of 1.7 W is obtained with the 22-m fiber. The lower average output powers obtained with the longer system are probably a consequence of the background losses of the fiber in the 2.8-3.6 µm spectral range (from ~0.03 to 0.06 dB/m) and the additional losses induced from the SSFS process.

In this example, the estimated energies and peak powers of the main soliton as a function of the pump power are calculated using both the temporal durations and the average power inferred from the spectra since these measurements were made for the whole range of pump powers. These values are indicated on each spectrum of FIGS. 19A-B. Soliton pulses with 37 nJ of energy and more than 200 kW of peak power are generated at 3.4 µm with the 8-m fiber while a 30-nJ, 109-kW soliton at 3.59 µm is obtained using the 22-m system. Based on the nonlinear parameter and group velocity dispersion of the fiber evaluated from the Sellmeier equations derived for multicomponent fluoride glasses ["L. Zhang, F. Gan, and P. Wang, Appl. Opt. 33, 50 (1994)"], the generated pulses have a soliton number of 1.24 and 1.07 at 3.4 µm and 3.6 µm respectively. Despite the uncertainty on the estimated nonlinear and dispersive properties of the fiber in this wavelength range, these values are relatively close to unity and thus further confirm that high energy fundamental solitons are generated from this system.

Figure 22:
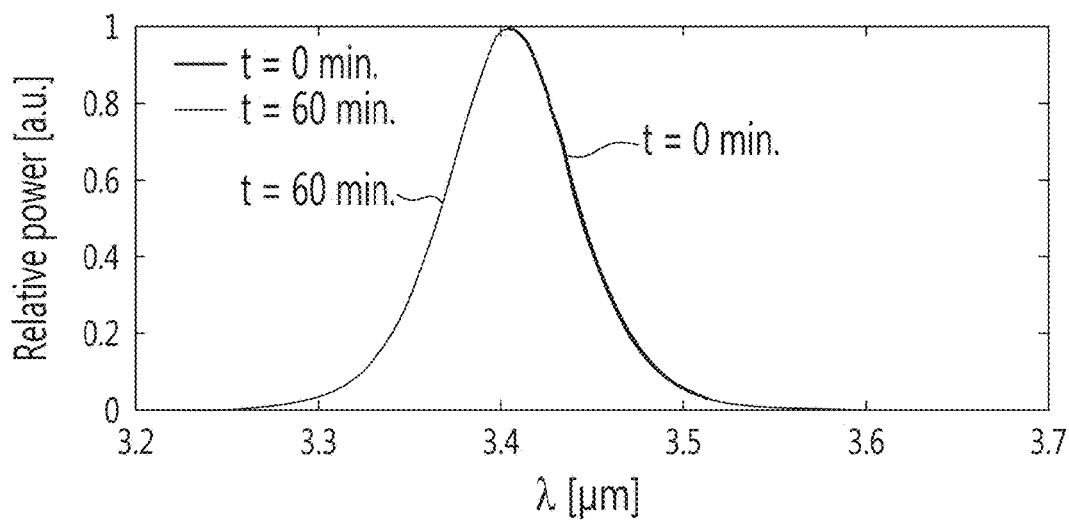
FIG. 22 is a graph showing output optical spectra of a mid-infrared laser beam of the mid-infrared laser of FIG. 17 taken at 60 minutes from one another, in accordance with an embodiment.
Figure 22A:
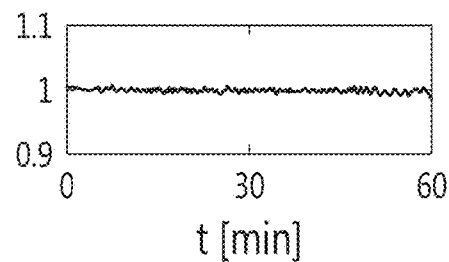
FIG. 22A is a graph showing temporal evolution of the normalized output power of a mid-infrared laser beam of the mid-infrared laser of FIG. 17 as measured at 3.4 µm and over 60 minutes.

The stability of the 8-m system was also evaluated by measuring the normalized power fluctuations at the central wavelength of the main soliton (i.e. at 3.4 µm) over one hour (acquisition rate=4 Hz) using the monochromator with a 0.4-nm spectral resolution. A standard deviation of 0.35% (see FIG. 22A) in the normalized output power demonstrates the good stability of the system. As shown in FIG. 22, the output optical spectrum of the output soliton remained essentially unchanged after 1 hour of operation.

Referring back to FIGS. 19A-B, it can be seen that by controlling the fiber length of the passive fiber segment 1210" allows for optimizing the output performances within a certain wavelength range. For instance, by reducing the passive fiber segment 1210", one could target the 2.94-µm band for medical applications. The SSFS also has a strong dependence on the duration of the generated soliton ($\Delta f \propto \tau_0^{-4}$), which depends on the nonlinear and dispersive properties of the fiber ["G. P. Agrawal, Nonlinear Fiber Optics, 5th ed. (Academic, 2012)"]. Consequently, the geometry and guiding properties of the length of fiber 1210 can be engineered to allow further shifting into the mid-infrared. For instance, as mentioned above, indium fluoride fibers, which have a high transmittance up to 5 µm, can also be integrated into the laser system to ultimately produce tunable high-power soliton pulses covering the whole 3-5 µm region. It is noted that with the developments of new laser architectures and fiberized components in the mid-infrared, the mid-infrared laser system 1200 may become alignment-free and extremely compact and robust.

Figure 23:
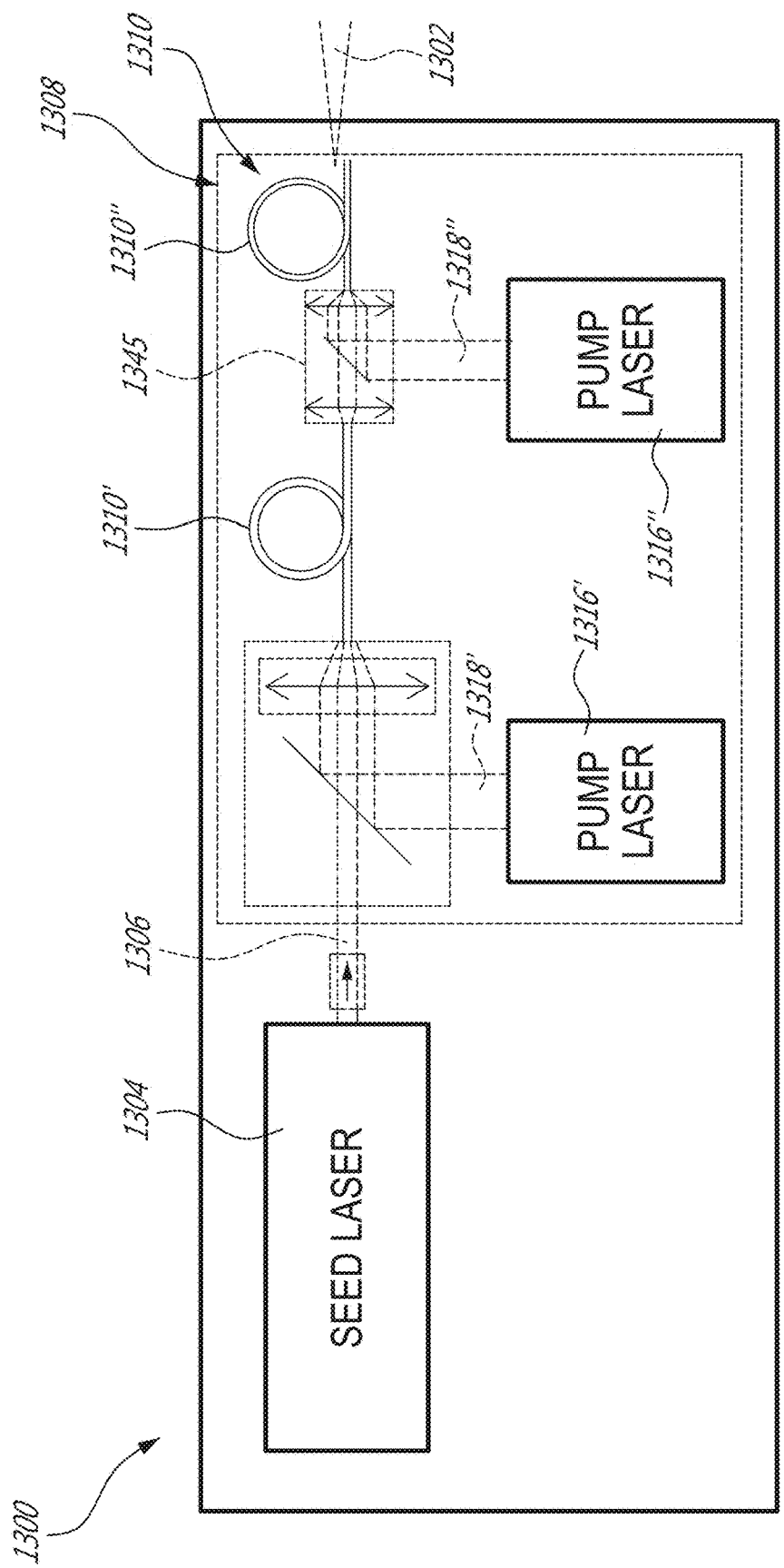
FIG. 23 shows another example of a mid-infrared laser system having two pump lasers, in accordance with an embodiment.

FIG. 23 shows another example of a mid-infrared laser system 1300 adapted to generate a mid-infrared laser beam 1302. As depicted, the mid-infrared laser system 1300 has a seed laser 1304 adapted to generate a seed laser beam 1306 and an amplifier 1308. The amplifier 1308 has a length of fiber 1310 having a first active fiber segment 1310' optically coupled to a second active fiber segment 1310" via a lens system 1345. The amplifier 1308 also has a first pump laser 1316' and a second pump laser 1316" operable to simultaneously pump a respective one of the first and second active fiber segments 1310' and 1310" via first and second pump laser beams 1318' and 1318".

It is intended that the first active fiber segment 1310' can be pumped to provide a first gain bandwidth whereas the second active fiber segment 1310" can be pumped to provide a second gain bandwidth ranging at longer wavelengths than the first gain bandwidth. Also, in some embodiments, the first active fiber segment 1310' can be made of a first low phonon energy glass having a first transmittance window and the second active fiber segment 1310" can be made of a second low phonon energy glass having a second transmittance window ranging at longer wavelengths than the first transmittance window of the first low phonon energy glass. In this way, the output optical spectrum of the mid-infrared laser beam 1302 can be amplified and shifted at longer wavelengths.

More specifically, the first gain bandwidth can correspond to the seed wavelength of the seed laser beam 1306 such that the first active fiber segment 1310' can be used to amplify the seed laser beam 1306 and provide, at its end, an intermediate mid-infrared laser beam 1302'. When the first pump laser 1316' is operated above a first spectrum modification threshold, an intermediate optical spectrum of the intermediate mid-infrared laser beam 1302' can be shifted relative to the seed optical spectrum, as described above. Additionally, in this example, the intermediate optical spectrum is shifted to correspond to the second gain bandwidth of the second active fiber segment 1310". Accordingly, when the second pump laser 1316" is operated above a second spectrum modification threshold, the second active fiber segment 1310" can be used to amplify the intermediate mid-infrared laser beam 1302" and further shift its optical spectrum towards longer wavelengths.

In one specific embodiment, the first active fiber segment 1310' is made of a zirconium fluoride glass having a first transmittance window up to 4.2 µm and pumpable to provide a first gain bandwidth near 2.8 µm. In contrast, the second active fiber segment 1310" is made of an indium fluoride glass having a second transmittance window up to 5.2 µm and pumpable to provide a second gain bandwidth near 3.9 µm when doped with holmium ions, for instance.

In another specific embodiment, the first active fiber segment 1310' and the second active fiber segment 1310" are made of a same low phonon energy glass doped with a same laser-active dopant but pumped at different laser transitions. For instance, the first and second active fiber segments 1310' and 1310" can be an erbium-doped zirconium fluoride glass wherein the first active fiber segment 1310' is pumped at 980 nm by a first pump laser to provide a first gain bandwidth near 2.8 µm, and wherein the second active fiber segment 1310" is pumped at both 980 nm and 2.0 µm using a combination of the first pump laser and a second pump laser to provide a second gain bandwidth near 3.5 µm.

Other embodiments of the mid-infrared laser system can include two or more pump lasers. In some embodiments, the first active fiber segment and the second active fiber segment are fusion spliced to one another, For instance, in one of these embodiments, the first and second pump lasers are both launched into the first active fiber segment or the second active fiber segment. In another of these embodiments, the first pump laser is launched into the first active fiber segment and the second pump laser is launched into the second active fiber segment such that the first and second pump laser beams propagate in opposite directions along the length of fiber.

As can be understood, the examples described above and illustrated are intended to be exemplary only. For instance, a mid-infrared laser system can include any suitable combination of active and passive fiber segments, endcap(s) and/or bandwidth gain reflector(s) in view of a mid-infrared laser beam sought for a given application. The mid-infrared laser system can include a frame to which the components are all directly or indirectly mounted. The mid-infrared laser system can also include a computer having one or more processor and one or more computer-readable memory having instructions stored thereon which can be executed to control the pump power in order to obtain a mid-infrared laser beam having a target output optical spectrum. In embodiments wherein optical power is required in a specific region of the mid-infrared (e.g., between 3 µm and 5 µm), a band pass filter can be provided in the path of the mid-infrared laser beam to filter out undesired wavelengths. The scope is indicated by the appended claims.

What is claimed is:

1. A mid-infrared laser system comprising:
   an amplifier including
      at least one pump laser adapted to generate a pump laser beam; and
      a length of fiber made of a low phonon energy glass and having at least one laser-active doped region between a first end and a second end;
   a seed laser adapted to generate a seed laser beam having a seed optical spectrum in a mid-infrared portion of an electromagnetic spectrum, the seed laser beam being launched into the first end to generate a mid-infrared laser beam outputted from the second end via stimulated emission upon pumping of the at least one laser-active doped region with the pump laser beam; and a spectrum modification threshold above which a power of the pump laser beam causes the mid-infrared laser beam to have an output optical spectrum being at least one of broadened and shifted relative to the seed optical spectrum.

2. The mid-infrared laser system of claim 1 wherein the seed laser beam has a seed wavelength equal or above 2.5 µm.

3. The mid-infrared laser system of claim 2 wherein the output optical spectrum of the mid-infrared laser beam includes at least 80% of its optical power at wavelengths longer than 3.0 µm.

4. The mid-infrared laser system of claim 1 wherein at least one of the first end and the second end of the length of fiber has an endcap, the endcap including a cylindrical waveguide having a first face serially connected to the at least one of the first end and the second end and being made of a low phonon energy glass being less permeable to OH— ions than the low phonon energy glass of the length of fiber.

5. The mid-infrared laser system of claim 4 wherein the endcap has a second face opposite to the first face, the second face being non perpendicular to a longitudinal axis of the cylindrical waveguide.

6. The mid-infrared laser system of claim 4 wherein the cylindrical waveguide is an optical fiber having at least one of no core and a core larger than a core of the length of fiber.

7. The mid-infrared laser system of claim 1 further comprising a bandwidth gain reflector at the second end of the length of fiber, the bandwidth gain reflector reflecting, away from the length of fiber, optical power at wavelengths within a gain bandwidth of the laser-active doped region.

8. The mid-infrared laser system of claim 7 wherein the bandwidth gain reflector is provided in the form of an tilted Bragg grating inscribed proximate to the second end of the length of fiber.

9. The mid-infrared laser system of claim 1 wherein the length of fiber includes an active fiber segment and a passive fiber segment serially connected to one another, the active fiber segment having the first end and the passive fiber segment having the second end.

10. The mid-infrared laser system of claim 9 wherein the active fiber segment is made of a first low phonon energy glass having a first transmittance window and the passive fiber segment is made of a second low phonon energy glass having a second transmittance window ranging at longer wavelengths than the first transmittance window of the first low phonon energy glass.

11. The mid-infrared laser system of claim 9 wherein the length of fiber includes a pump stripper for flushing out the pump laser beam away from the length of fiber, the pump stripper dividing the length of fiber into the active fiber segment and the passive fiber segment.

12. The mid-infrared laser system of claim 1 wherein the length of fiber includes a pump stripper for flushing the pump laser beam away from the length of fiber.

13. The mid-infrared laser system of claim 1 wherein the length of fiber includes at least a first active fiber segment and a second active fiber segment optically coupled to one another, the at least one pump laser including at least a first pump laser and a second pump laser optically coupled to the length of fiber and operable to simultaneously pump a respective one of the first and second active fiber segments, the first active fiber segment providing a first gain bandwidth and the second active fiber segment providing a second gain bandwidth ranging at longer wavelengths than the first gain bandwidth.

14. The mid-infrared laser system of claim 13 wherein the first active fiber segment is made of a first low phonon energy glass having a first transmittance window and the second active fiber segment is made of a second low phonon energy glass having a second transmittance window ranging at longer wavelengths than the first transmittance window of the first low phonon energy glass.

15. A mid-infrared optical amplifier for amplifying a seed laser beam in a mid-infrared portion of an electromagnetic spectrum, the mid-infrared optical amplifier comprising:

at least one pump laser adapted to generate a pump laser beam;

a length of fiber made of a low phonon energy glass and having at least one laser-active doped region between a first end and a second end, the seed laser beam being launchable into the first end to generate a mid-infrared laser beam outputted from the second end via stimulated emission upon pumping of the at least one laser-active doped region with the pump laser beam; and a spectrum modification threshold above which a power of the pump laser beam causes the mid-infrared laser beam to have an output optical spectrum being at least one of broadened and shifted relative to the seed optical spectrum.

16. The mid-infrared optical amplifier of claim 15 wherein at least one of the first end and the second end of the length of fiber has an endcap, the endcap including a cylindrical waveguide having a first face serially connected to the at least one of the first end and the second end and being made of a low phonon energy glass being less permeable to OH— ions than the low phonon energy glass of the length of fiber.

17. The mid-infrared optical amplifier of claim 16 wherein the endcap has a second face opposite to the first face, the second face being non perpendicular to a longitudinal axis of the cylindrical waveguide.

18. The mid-infrared optical amplifier of claim 16 wherein the cylindrical waveguide is an optical fiber having at least one of no core and a core larger than a core of the length of fiber.

19. The mid-infrared optical amplifier of claim 15 further comprising a bandwidth gain reflector at the second end of the length of fiber, the bandwidth gain reflector reflecting, away from the length of fiber, optical power at wavelengths within a gain bandwidth of the laser-active doped region.

20. The mid-infrared optical amplifier of claim 19 wherein the bandwidth gain reflector is provided in the form of a tilted Bragg grating inscribed proximate to the second end of the length of fiber.

21. The mid-infrared optical amplifier of claim 15 wherein the length of fiber includes an active fiber segment and an additional fiber segment serially connected to one another, the active fiber segment having the first end and the additional fiber segment having the second end, the active fiber segment being made of a first low phonon energy glass having a first transmittance window and the additional fiber segment being made of a second low phonon energy glass having a second transmittance window ranging at longer wavelengths than the first transmittance window of the first low phonon energy glass.

22. A method of operating a mid-infrared laser system having a seed laser adapted to generate a seed laser beam having a seed optical spectrum in a mid-infrared portion of an electromagnetic spectrum, and an amplifier including at least one pump laser adapted to generate a pump laser beam and a length of fiber made of a low phonon energy glass and having at least one laser-active doped region, the method comprising the steps of:
- pumping the at least one laser-active doped region of the length of fiber by launching the pump laser beam into one of the first end and a second end;
- seeding the length of fiber by launching the seed laser beam into the first end;
- outputting, at the second end, a mid-infrared laser beam resulting from the optical amplification of the seed laser beam via stimulated emission; and
- modifying an output optical spectrum of the mid-infrared laser beam by varying a power of the pump laser beam above a spectrum modification threshold.

* * * * *